United States Patent
Pan et al.

(10) Patent No.: US 12,155,477 B2
(45) Date of Patent: Nov. 26, 2024

(54) PRIORITY-BASED CHANNEL CODING FOR CONTROL INFORMATION

(71) Applicant: InterDigital Patent Holdings, Inc., Wilmington, DE (US)

(72) Inventors: Kyle Jung-Lin Pan, Saint James, NY (US); Fengjun Xi, San Diego, CA (US); Chunxuan Ye, San Diego, CA (US)

(73) Assignee: InterDigital Patent Holdings, Inc., Wilmington, DE (US)

( * ) Notice: Subject to any disclaimer, the term of this patent is extended or adjusted under 35 U.S.C. 154(b) by 0 days.

(21) Appl. No.: 17/863,943

(22) Filed: Jul. 13, 2022

(65) Prior Publication Data
US 2022/0376822 A1 Nov. 24, 2022

Related U.S. Application Data

(63) Continuation of application No. 16/322,055, filed as application No. PCT/US2017/046206 on Aug. 10, 2017, now Pat. No. 11,431,441.
(Continued)

(51) Int. Cl.
*H03M 13/09* (2006.01)
*H03M 13/13* (2006.01)
(Continued)

(52) U.S. Cl.
CPC .......... *H04L 1/0061* (2013.01); *H03M 13/09* (2013.01); *H03M 13/13* (2013.01);
(Continued)

(58) Field of Classification Search
CPC ... H04L 1/0061; H04L 1/0041; H04L 1/0057; H04L 1/0072; H04L 1/0088;
(Continued)

(56) References Cited

U.S. PATENT DOCUMENTS

| 2009/0199055 A1* | 8/2009 | Chen ...................... H04L 1/007 714/701 |
| 2011/0128942 A1 | 6/2011 | Kim et al. |

(Continued)

FOREIGN PATENT DOCUMENTS

| CN | 101064664 A | 10/2007 |
| CN | 101820542 A | 9/2010 |

(Continued)

OTHER PUBLICATIONS

3rd Generation Partnership Project (3GPP), R1-163274, "Evaluation Methodology for 5G New Radio Channel Coding", Nokia, Alcatel-Lucent Shanghai Bell, 3GPP TSG-RAN WG1 #84bis, Busan, Korea, Apr. 11-15, 2016, 4 pages.
(Continued)

*Primary Examiner* — Siren Wei
(74) *Attorney, Agent, or Firm* — Flaster Greenberg, P.C.

(57) ABSTRACT

Systems, methods, and instrumentalities are disclosed for priority-based channel coding for control information. A wireless transmit/receive unit (WTRU) may sort control information associated with a first control information type into a first control information group and the control information associated with a second control information type into a second control information group, for example, based on respective priorities associated with the first and second control information types. The WTRU may group one or more bits of the first control information group into a first bit level control information group and a second bit level control information group based on priority. The WTRU may selectively apply a cyclic redundancy check (CRC) to the first control information group, the second control information group, the first bit level control information group, and/or the second bit level control information group.

6 Claims, 23 Drawing Sheets

Related U.S. Application Data

(60) Provisional application No. 62/443,059, filed on Jan. 6, 2017, provisional application No. 62/400,704, filed on Sep. 28, 2016, provisional application No. 62/373,005, filed on Aug. 10, 2016.

(51) Int. Cl.
| | |
|---|---|
| *H03M 13/35* | (2006.01) |
| *H04L 1/00* | (2006.01) |
| *H04B 7/0456* | (2017.01) |
| *H04B 7/06* | (2006.01) |

(52) U.S. Cl.
CPC ........ *H03M 13/356* (2013.01); *H04L 1/0041* (2013.01); *H04L 1/0057* (2013.01); *H04L 1/0072* (2013.01); *H04L 1/0088* (2013.01); *H04B 7/0486* (2013.01); *H04B 7/0623* (2013.01); *H04B 7/0626* (2013.01); *H04B 7/0632* (2013.01); *H04B 7/0639* (2013.01)

(58) Field of Classification Search
CPC .... H03M 13/09; H03M 13/13; H03M 13/356; H04B 7/0486; H04B 7/0623; H04B 7/0626; H04B 7/0632; H04B 7/0639
See application file for complete search history.

(56) References Cited

U.S. PATENT DOCUMENTS

| | | | |
|---|---|---|---|
| 2011/0255428 A1 | 10/2011 | Park et al. | |
| 2013/0080743 A1 | 3/2013 | Heaslip | |
| 2014/0169492 A1* | 6/2014 | Mahdavifar | H03M 13/13 375/267 |
| 2014/0173376 A1 | 6/2014 | Jeong et al. | |
| 2016/0182187 A1 | 6/2016 | Kim et al. | |
| 2016/0352464 A1 | 12/2016 | Shen et al. | |
| 2017/0111060 A1 | 4/2017 | Huang et al. | |
| 2017/0288703 A1 | 10/2017 | Shen et al. | |
| 2017/0353271 A1* | 12/2017 | Kudekar | H04L 1/0041 |
| 2018/0013868 A1* | 1/2018 | Lin | H03M 13/413 |

FOREIGN PATENT DOCUMENTS

| | | |
|---|---|---|
| CN | 102113255 A | 6/2011 |
| CN | 102932696 A | 2/2013 |
| CN | 103197923 A | 7/2013 |
| WO | WO 2016/101089 A1 | 6/2016 |

OTHER PUBLICATIONS

3rd Generation Partnership Project (3GPP), R1-164565, "Discussions on Polar Code Design", LG Electronics, 3GPP TSG RAN WG1 Meeting #85, Nanjing, China, May 23- 27, 2016, 5 pages.
3rd Generation Partnership Project (3GPP), R1-1611254, "Details of the Polar Code Design", Huawei, HiSilicon, 3GPP TSG RAN WG1 Meeting #87, Reno, USA, Nov. 10-14, 2016, 15 pages.
3rd Generation Partnership Project (3GPP), R1-164039, "Polar Codes—Encoding and Decoding", Huawei, HiSilicon, 3GPP TSG RAN WG1 Meeting #xx, Nanjing, China, May 23-27, 2016, 7 pages.
3rd Generation Partnership Project (3GPP), R1-1711221, "Design of Polar Code for Large UCI with Segmentation", Qualcomm Incorporated, 3GPP TSG-RAN WG1 NR Ad-Hoc#2, Qingdao, P.R. China, Jun. 27-30, 2017, DD. 1-4.
3rd Generation Partnership Project (3GPP), TR 38.913 V0.3.0, "Technical Specification Group Radio Access Network, Study on Scenarios and Requirements for Next Generation Access Technologies (Release 14)", Mar. 2016, 30 pages.
3rd Generation Partnership Project (3GPP), TS 36.212 V13.1.0, "E-UTRA; Multiplexing and Channel Coding (Release 13)", Mar. 2016, 129 pages.
Arikan, Erdal, "Channel Polarization: A Method for Constructing Capacity-Achieving Codes for Symmetric Binary-Input Memoryless Channels", IEEE Transactions on Information Theory, vol. 55, No. 7, Jul. 2009, pp. 3051-3073.
Du et al., "Exploiting the UEP Property of Polar Codes to Reduce Image Distortions Induced by Transmission Errors", IEEE/CIC ICCC 2015 Symposium on Wireless Networking and Multimedia, Nov. 2, 2015, 5 pages.
Guo et al., "Multi-CRC Polar Codes and Their Applications", IEEE Communications Letters, vol. 20, No. 2, Feb. 2016, pp. 212-215.
Hattachi et al., "NGMN 5G White Paper", Version 1.0, Feb. 17, 2015, 125 pages.
ITU-R, "IMT Vision—Framework and Overall Objectives of the Future Development of IMT for 2020 and Beyond", Recommendation ITU-R M.2083-0, M Series, Mobile, Radiodetermination, Amateur and Related Satellite Services, Sep. 2015, 21 pages.
Niu et al., "CRC-Aided Decoding of Polar Codes", IEEE Communications Letters, vol. 16, No. 10, Oct. 2012, pp. 1668-1671.
Tal et al., "How to Construct Polar Codes", IEEE Transactions on Information Theory, vol. 59, No. 10, Oct. 2013, pp. 6562-6582.
Tal et al., "List Decoding of Polar Codes", arXiv:1206.0050v1, May 31, 2012, pp. 1-11.
Trifonov, Peter, "Efficient Design and Decoding of Polar Codes", IEEE Transactions on Communications, vol. 60, No. 11, Nov. 2012, pp. 3221-3227.
Vangala et al., "A Comparative Study of Polar Code Constructions for the AWGN Channel", arXiv:1501.02473v1, Jan. 11, 2015, pp. 1-9.
Zhou et al., "Segmented CRC-aided SC List Polar Decoding", IEEE 83rd Vehicular Technology Conference (VTC Spring), May 2016, 5 pages.
CN 101820542 A, Cited in Information Disclosure Statement dated June. 25, 2021, in related U.S. Appl. No. 16/322,055. *English translation of description and claims provided by Espacenet.com.
CN 102932696 A, Cited in Information Disclosure Statement dated Jun. 25, 2021, in related U.S. Appl. No. 16/322,055. *English translation of description and claims provided by Espacenet.com.

* cited by examiner

PRIORITY-BASED CHANNEL CODING FOR CONTROL INFORMATION

CROSS REFERENCE TO RELATED APPLICATIONS

This application is a continuation of U.S. Non-Provisional application Ser. No. 16/322,055, filed Jan. 30, 2019, which is the National Stage entry under 35 U.S.C. § 371 of Patent Cooperation Treaty Application PCT/US2017/046206, filed Aug. 10, 2017, which claims the benefit of U.S. Provisional Patent Application No. 62/373,005, filed Aug. 10, 2016, U.S. Provisional Patent Application No. 62/400,704, filed Sep. 28, 2016, and U.S. Provisional Patent Application No. 62/443,059, filed Jan. 6, 2017, all of which are hereby incorporated by reference herein.

BACKGROUND

Use cases for emerging 5G systems may include Enhanced Mobile Broadband (eMBB), Massive Machine Type Communications (mMTC) and Ultra Reliable and Low latency Communications (URLLC). Different use cases may focus on different requirements such as higher data rate, higher spectrum efficiency, low power and higher energy efficiency, lower latency, and/or higher reliability.

Acquisition of control information may be important for 5G new radio (NR). Efficient and reliable delivery of control information may be desirable. Unreliable control information may impact the performance, data rate, latency, and/or MIMO system operations. If acquisition of scheduling grant is not reliable, latency and retransmission of Hybrid-ARQ (HARQ) and/or scheduling time may be affected. If acquisition of CQI is not reliable, scheduling, link adaptation, and/or MCS may be impacted. When acquisition of ACK/NACK is not reliable, HARQ may be impacted. If RI/PMI is not reliable, MIMO operation and/or performance may be impacted.

SUMMARY

Systems, methods, and instrumentalities are disclosed for priority-based channel coding for control information. A wireless transmit/receive unit (WTRU) may determine control information associated with a first control information type, a second control information type, and/or a third control information type. The WTRU may determine the control information based on a data transmission. The control information may be associated with a plurality of control information types. The plurality of control information types may include a synchronization signal (SS) block index (SSBI), a rank indicator (RI), a precoding matrix indicator (PMI), a channel quality indicator (CQI), a CSI-RS resource indicator (CRI), a precoder type indicator (PTI), a BeamID, an ACK/NACK, and/or a scheduling request (SR). The WTRU may sort the control information associated with the first control information type into a first control information group. The WTRU may sort the control information associated with the second control information type into a second control information group. The WTRU may sort control information associated with the third control information type into a third control information group and a fourth control information group. The third control information group and the fourth control information group may be associated with multiple carriers, multiple spectrums, multiple frequencies, and/or multiple bands. The control information may be sorted based on respective priorities associated with the first and second control information types. The control information may be uplink control information.

The WTRU may group one or more bits of the first control information group into a first bit level control information group and a second bit level control information group. The first bit level control information group may be associated with a first priority. The second bit level control information group may be associated with a second priority. The WTRU may group the one or more bits of the first control information group based on the first priority and the second priority. The first bit level control information group may be a control least significant bits (LSB) group. The second bit level control information group may be a control most significant bits (MSB) group. The WTRU may group one or more bits of the second control information group into a third bit level control information group and a fourth bit level control information group. The third bit level control information group may be associated with a third priority. The fourth bit level control information group may be associated with a fourth priority. The bits of the second control information group may be grouped based on the third priority and the fourth priority. The third and fourth bit level control information groups may be associated with multiple carriers, spectrums, frequencies, and/or bands.

The WTRU may selectively apply a first cyclic redundancy check (CRC) to the first control information group, the second control information group, the first bit level control information group, and/or the second bit level control information group. The WTRU may selectively apply the first CRC by determining to attach the first CRC to the first bit level control information group or the second bit level control information group. The WTRU may selectively apply the first CRC by determining to jointly attach the first CRC to the first and second bit level control information groups. The WTRU may selectively apply the first CRC by determining to attach the first CRC to each MSB bit level control information group. The WTRU may selectively apply the first CRC by determining to attach the first CRC to each MSB bit level control information group and attach a second CRC to each LSB bit level control information group.

The WTRU may map the control information to one or more bit channels of a polar encoder, for example, based on the sorting, the grouping, and/or the selective application of the CRC. The WTRU may determine whether to use a concatenated polar encoder or a non-concatenated polar encoder, for example, based on performance and/or latency requirements. The WTRU may determine the performance and/or latency requirements based on a capability of a decoder, an information block size, and/or a coding rate.

DETAILED DESCRIPTION

A detailed description of illustrative embodiments will now be described with reference to the various Figures. Although this description provides a detailed example of possible implementations, it should be noted that the details are intended to be exemplary and in no way limit the scope of the application.

Figure 1A:
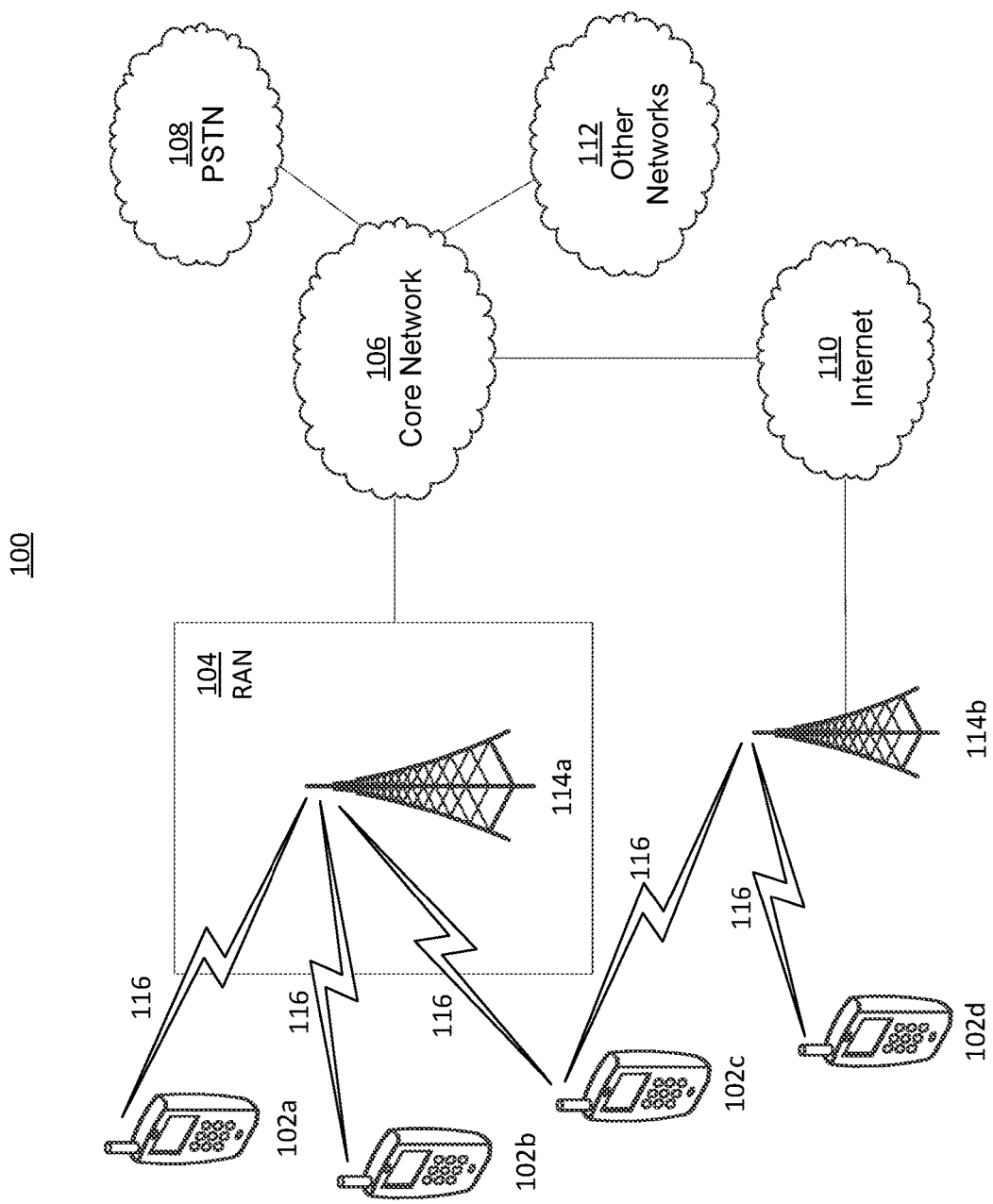
FIG. 1A is a system diagram illustrating an example communications system in which one or more disclosed embodiments may be implemented.

FIG. 1A is a diagram illustrating an example communications system 100 in which one or more disclosed embodiments may be implemented. The communications system 100 may be a multiple access system that provides content, such as voice, data, video, messaging, broadcast, etc., to multiple wireless users. The communications system 100 may enable multiple wireless users to access such content through the sharing of system resources, including wireless bandwidth. For example, the communications systems 100 may employ one or more channel access methods, such as code division multiple access (CDMA), time division multiple access (TDMA), frequency division multiple access (FDMA), orthogonal FDMA (OFDMA), single-carrier FDMA (SC-FDMA), zero-tail unique-word DFT-Spread OFDM (ZT UW DTS-s OFDM), unique word OFDM (UW-OFDM), resource block-filtered OFDM, filter bank multicarrier (FBMC), and the like.

As shown in FIG. 1A, the communications system 100 may include wireless transmit/receive units (WTRUs) 102a, 102b, 102c, 102d, a RAN 104/113, a CN 106/115, a public switched telephone network (PSTN) 108, the Internet 110, and other networks 112, though it will be appreciated that the disclosed embodiments contemplate any number of WTRUs, base stations, networks, and/or network elements. Each of the WTRUs 102a, 102b, 102c, 102d may be any type of device configured to operate and/or communicate in a wireless environment. By way of example, the WTRUs 102a, 102b, 102c, 102d, any of which may be referred to as a "station" and/or a "STA", may be configured to transmit and/or receive wireless signals and may include a user equipment (UE), a mobile station, a fixed or mobile subscriber unit, a subscription-based unit, a pager, a cellular telephone, a personal digital assistant (PDA), a smartphone, a laptop, a netbook, a personal computer, a wireless sensor, a hotspot or Mi-Fi device, an Internet of Things (IoT) device, a watch or other wearable, a head-mounted display (HMD), a vehicle, a drone, a medical device and applications (e.g., remote surgery), an industrial device and applications (e.g., a robot and/or other wireless devices operating in an industrial and/or an automated processing chain contexts), a consumer electronics device, a device operating on commercial and/or industrial wireless networks, and the like. Any of the WTRUs 102a, 102b, 102c and 102d may be interchangeably referred to as a UE.

The communications systems 100 may also include a base station 114a and/or a base station 114b. Each of the base stations 114a, 114b may be any type of device configured to wirelessly interface with at least one of the WTRUs 102a, 102b, 102c, 102d to facilitate access to one or more communication networks, such as the CN 106/115, the Internet 110, and/or the other networks 112. By way of example, the base stations 114a, 114b may be a base transceiver station (BTS), a Node-B, an eNode B, a Home Node B, a Home eNode B, a gNB, a NR NodeB, a site controller, an access point (AP), a wireless router, and the like. While the base stations 114a, 114b are each depicted as a single element, it will be appreciated that the base stations 114a, 114b may include any number of interconnected base stations and/or network elements.

The base station 114a may be part of the RAN 104/113, which may also include other base stations and/or network elements (not shown), such as a base station controller (BSC), a radio network controller (RNC), relay nodes, etc. The base station 114a and/or the base station 114b may be configured to transmit and/or receive wireless signals on one or more carrier frequencies, which may be referred to as a cell (not shown). These frequencies may be in licensed spectrum, unlicensed spectrum, or a combination of licensed and unlicensed spectrum. A cell may provide coverage for a wireless service to a specific geographical area that may be relatively fixed or that may change over time. The cell may further be divided into cell sectors. For example, the cell associated with the base station 114a may be divided into three sectors. Thus, in one embodiment, the base station 114a may include three transceivers, i.e., one for each sector of the cell. In an embodiment, the base station 114a may employ multiple-input multiple output (MIMO) technology and may utilize multiple transceivers for each sector of the cell. For example, beamforming may be used to transmit and/or receive signals in desired spatial directions.

The base stations 114a, 114b may communicate with one or more of the WTRUs 102a, 102b, 102c, 102d over an air interface 116, which may be any suitable wireless communication link (e.g., radio frequency (RF), microwave, centimeter wave, micrometer wave, infrared (IR), ultraviolet (UV), visible light, etc.). The air interface 116 may be established using any suitable radio access technology (RAT).

More specifically, as noted above, the communications system 100 may be a multiple access system and may employ one or more channel access schemes, such as CDMA, TDMA, FDMA, OFDMA, SC-FDMA, and the like. For example, the base station 114*a* in the RAN 104/113 and the WTRUs 102*a*, 102*b*, 102*c* may implement a radio technology such as Universal Mobile Telecommunications System (UMTS) Terrestrial Radio Access (UTRA), which may establish the air interface 115/116/117 using wideband CDMA (WCDMA). WCDMA may include communication protocols such as High-Speed Packet Access (HSPA) and/or Evolved HSPA (HSPA+). HSPA may include High-Speed Downlink (DL) Packet Access (HSDPA) and/or High-Speed UL Packet Access (HSUPA).

In an embodiment, the base station 114*a* and the WTRUs 102*a*, 102*b*, 102*c* may implement a radio technology such as Evolved UMTS Terrestrial Radio Access (E-UTRA), which may establish the air interface 116 using Long Term Evolution (LTE) and/or LTE-Advanced (LTE-A) and/or LTE-Advanced Pro (LTE-A Pro).

In an embodiment, the base station 114*a* and the WTRUs 102*a*, 102*b*, 102*c* may implement a radio technology such as NR Radio Access, which may establish the air interface 116 using New Radio (NR).

In an embodiment, the base station 114*a* and the WTRUs 102*a*, 102*b*, 102*c* may implement multiple radio access technologies. For example, the base station 114*a* and the WTRUs 102*a*, 102*b*, 102*c* may implement LTE radio access and NR radio access together, for instance using dual connectivity (DC) principles. Thus, the air interface utilized by WTRUs 102*a*, 102*b*, 102*c* may be characterized by multiple types of radio access technologies and/or transmissions sent to/from multiple types of base stations (e.g., an eNB and a gNB).

In other embodiments, the base station 114*a* and the WTRUs 102*a*, 102*b*, 102*c* may implement radio technologies such as IEEE 802.11 (i.e., Wireless Fidelity (WiFi), IEEE 802.16 (i.e., Worldwide Interoperability for Microwave Access (WiMAX)), CDMA2000, CDMA2000 1x, CDMA2000 EV-DO, Interim Standard 2000 (IS-2000), Interim Standard 95 (IS-95), Interim Standard 856 (IS-856), Global System for Mobile communications (GSM), Enhanced Data rates for GSM Evolution (EDGE), GSM EDGE (GERAN), and the like.

The base station 114*b* in FIG. 1A may be a wireless router, Home Node B, Home eNode B, or access point, for example, and may utilize any suitable RAT for facilitating wireless connectivity in a localized area, such as a place of business, a home, a vehicle, a campus, an industrial facility, an air corridor (e.g., for use by drones), a roadway, and the like. In one embodiment, the base station 114*b* and the WTRUs 102*c*, 102*d* may implement a radio technology such as IEEE 802.11 to establish a wireless local area network (WLAN). In an embodiment, the base station 114*b* and the WTRUs 102*c*, 102*d* may implement a radio technology such as IEEE 802.15 to establish a wireless personal area network (WPAN). In yet another embodiment, the base station 114*b* and the WTRUs 102*c*, 102*d* may utilize a cellular-based RAT (e.g., WCDMA, CDMA2000, GSM, LTE, LTE-A, LTE-A Pro, NR etc.) to establish a picocell or femtocell. As shown in FIG. 1A, the base station 114*b* may have a direct connection to the Internet 110. Thus, the base station 114*b* may not be required to access the Internet 110 via the CN 106/115.

The RAN 104/113 may be in communication with the CN 106/115, which may be any type of network configured to provide voice, data, applications, and/or voice over internet protocol (VoIP) services to one or more of the WTRUs 102*a*, 102*b*, 102*c*, 102*d*. The data may have varying quality of service (QoS) requirements, such as differing throughput requirements, latency requirements, error tolerance requirements, reliability requirements, data throughput requirements, mobility requirements, and the like. The CN 106/115 may provide call control, billing services, mobile location-based services, pre-paid calling, Internet connectivity, video distribution, etc., and/or perform high-level security functions, such as user authentication. Although not shown in FIG. 1A, it will be appreciated that the RAN 104/113 and/or the CN 106/115 may be in direct or indirect communication with other RANs that employ the same RAT as the RAN 104/113 or a different RAT. For example, in addition to being connected to the RAN 104/113, which may be utilizing a NR radio technology, the CN 106/115 may also be in communication with another RAN (not shown) employing a GSM, UMTS, CDMA 2000, WiMAX, E-UTRA, or WiFi radio technology.

The CN 106/115 may also serve as a gateway for the WTRUs 102*a*, 102*b*, 102*c*, 102*d* to access the PSTN 108, the Internet 110, and/or the other networks 112. The PSTN 108 may include circuit-switched telephone networks that provide plain old telephone service (POTS). The Internet 110 may include a global system of interconnected computer networks and devices that use common communication protocols, such as the transmission control protocol (TCP), user datagram protocol (UDP) and/or the internet protocol (IP) in the TCP/IP internet protocol suite. The networks 112 may include wired and/or wireless communications networks owned and/or operated by other service providers. For example, the networks 112 may include another CN connected to one or more RANs, which may employ the same RAT as the RAN 104/113 or a different RAT.

Some or all of the WTRUs 102*a*, 102*b*, 102*c*, 102*d* in the communications system 100 may include multi-mode capabilities (e.g., the WTRUs 102*a*, 102*b*, 102*c*, 102*d* may include multiple transceivers for communicating with different wireless networks over different wireless links). For example, the WTRU 102*c* shown in FIG. 1A may be configured to communicate with the base station 114*a*, which may employ a cellular-based radio technology, and with the base station 114*b*, which may employ an IEEE 802 radio technology.

Figure 1B:
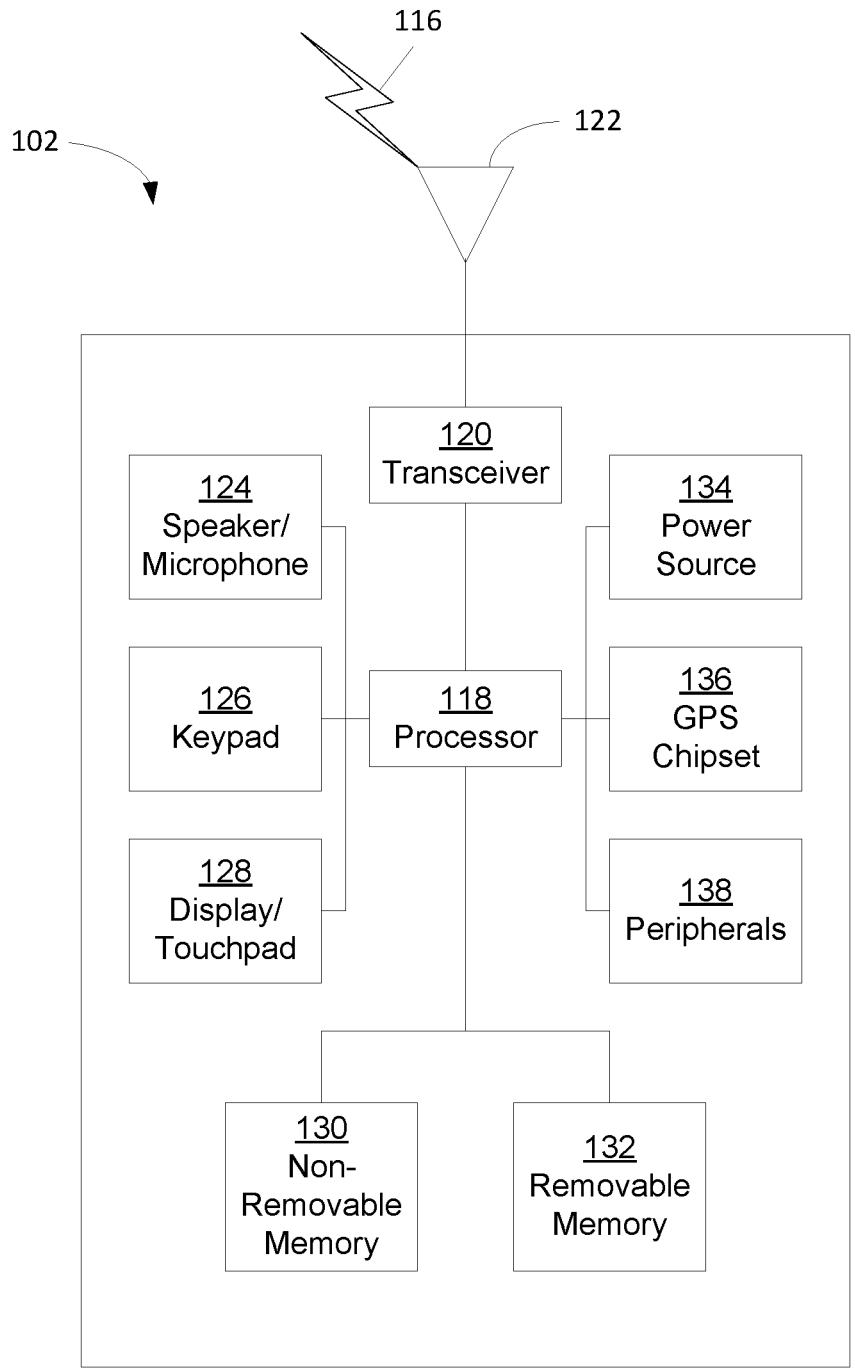
FIG. 1B is a system diagram illustrating an example wireless transmit/receive unit (WTRU) that may be used within the communications system illustrated in FIG. 1A according to an embodiment.

FIG. 1B is a system diagram illustrating an example WTRU 102. As shown in FIG. 1B, the WTRU 102 may include a processor 118, a transceiver 120, a transmit/receive element 122, a speaker/microphone 124, a keypad 126, a display/touchpad 128, non-removable memory 130, removable memory 132, a power source 134, a global positioning system (GPS) chipset 136, and/or other peripherals 138, among others. It will be appreciated that the WTRU 102 may include any sub-combination of the foregoing elements while remaining consistent with an embodiment.

The processor 118 may be a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), a state machine, and the like. The processor 118 may perform signal coding, data processing, power control, input/output processing, and/or any other functionality that enables the WTRU 102 to operate in a wireless environment. The processor 118 may be coupled to the transceiver 120, which may be coupled to the transmit/receive element 122. While FIG. 1B depicts the processor 118 and the transceiver 120 as separate components, it will be appreciated that the processor 118 and the transceiver 120 may be integrated together in an electronic package or chip.

The transmit/receive element 122 may be configured to transmit signals to, or receive signals from, a base station (e.g., the base station 114a) over the air interface 116. For example, in one embodiment, the transmit/receive element 122 may be an antenna configured to transmit and/or receive RF signals. In an embodiment, the transmit/receive element 122 may be an emitter/detector configured to transmit and/or receive IR, UV, or visible light signals, for example. In yet another embodiment, the transmit/receive element 122 may be configured to transmit and/or receive both RF and light signals. It will be appreciated that the transmit/receive element 122 may be configured to transmit and/or receive any combination of wireless signals.

Although the transmit/receive element 122 is depicted in FIG. 1B as a single element, the WTRU 102 may include any number of transmit/receive elements 122. More specifically, the WTRU 102 may employ MIMO technology. Thus, in one embodiment, the WTRU 102 may include two or more transmit/receive elements 122 (e.g., multiple antennas) for transmitting and receiving wireless signals over the air interface 116.

The transceiver 120 may be configured to modulate the signals that are to be transmitted by the transmit/receive element 122 and to demodulate the signals that are received by the transmit/receive element 122. As noted above, the WTRU 102 may have multi-mode capabilities. Thus, the transceiver 120 may include multiple transceivers for enabling the WTRU 102 to communicate via multiple RATs, such as NR and IEEE 802.11, for example.

The processor 118 of the WTRU 102 may be coupled to, and may receive user input data from, the speaker/microphone 124, the keypad 126, and/or the display/touchpad 128 (e.g., a liquid crystal display (LCD) display unit or organic light-emitting diode (OLED) display unit). The processor 118 may also output user data to the speaker/microphone 124, the keypad 126, and/or the display/touchpad 128. In addition, the processor 118 may access information from, and store data in, any type of suitable memory, such as the non-removable memory 130 and/or the removable memory 132. The non-removable memory 130 may include random-access memory (RAM), read-only memory (ROM), a hard disk, or any other type of memory storage device. The removable memory 132 may include a subscriber identity module (SIM) card, a memory stick, a secure digital (SD) memory card, and the like. In other embodiments, the processor 118 may access information from, and store data in, memory that is not physically located on the WTRU 102, such as on a server or a home computer (not shown).

The processor 118 may receive power from the power source 134, and may be configured to distribute and/or control the power to the other components in the WTRU 102. The power source 134 may be any suitable device for powering the WTRU 102. For example, the power source 134 may include one or more dry cell batteries (e.g., nickel-cadmium (NiCd), nickel-zinc (NiZn), nickel metal hydride (NiMH), lithium-ion (Li-ion), etc.), solar cells, fuel cells, and the like.

The processor 118 may also be coupled to the GPS chipset 136, which may be configured to provide location information (e.g., longitude and latitude) regarding the current location of the WTRU 102. In addition to, or in lieu of, the information from the GPS chipset 136, the WTRU 102 may receive location information over the air interface 116 from a base station (e.g., base stations 114a, 114b) and/or determine its location based on the timing of the signals being received from two or more nearby base stations. It will be appreciated that the WTRU 102 may acquire location information by way of any suitable location-determination method while remaining consistent with an embodiment.

The processor 118 may further be coupled to other peripherals 138, which may include one or more software and/or hardware modules that provide additional features, functionality and/or wired or wireless connectivity. For example, the peripherals 138 may include an accelerometer, an e-compass, a satellite transceiver, a digital camera (for photographs and/or video), a universal serial bus (USB) port, a vibration device, a television transceiver, a hands free headset, a Bluetooth® module, a frequency modulated (FM) radio unit, a digital music player, a media player, a video game player module, an Internet browser, a Virtual Reality and/or Augmented Reality (VR/AR) device, an activity tracker, and the like. The peripherals 138 may include one or more sensors, the sensors may be one or more of a gyroscope, an accelerometer, a hall effect sensor, a magnetometer, an orientation sensor, a proximity sensor, a temperature sensor, a time sensor; a geolocation sensor; an altimeter, a light sensor, a touch sensor, a magnetometer, a barometer, a gesture sensor, a biometric sensor, and/or a humidity sensor.

The WTRU 102 may include a full duplex radio for which transmission and reception of some or all of the signals (e.g., associated with particular subframes for both the UL (e.g., for transmission) and downlink (e.g., for reception) may be concurrent and/or simultaneous. The full duplex radio may include an interference management unit 139 to reduce and or substantially eliminate self-interference via either hardware (e.g., a choke) or signal processing via a processor (e.g., a separate processor (not shown) or via processor 118). In an embodiment, the WRTU 102 may include a half-duplex radio for which transmission and reception of some or all of the signals (e.g., associated with particular subframes for either the UL (e.g., for transmission) or the downlink (e.g., for reception)).

Figure 1C:
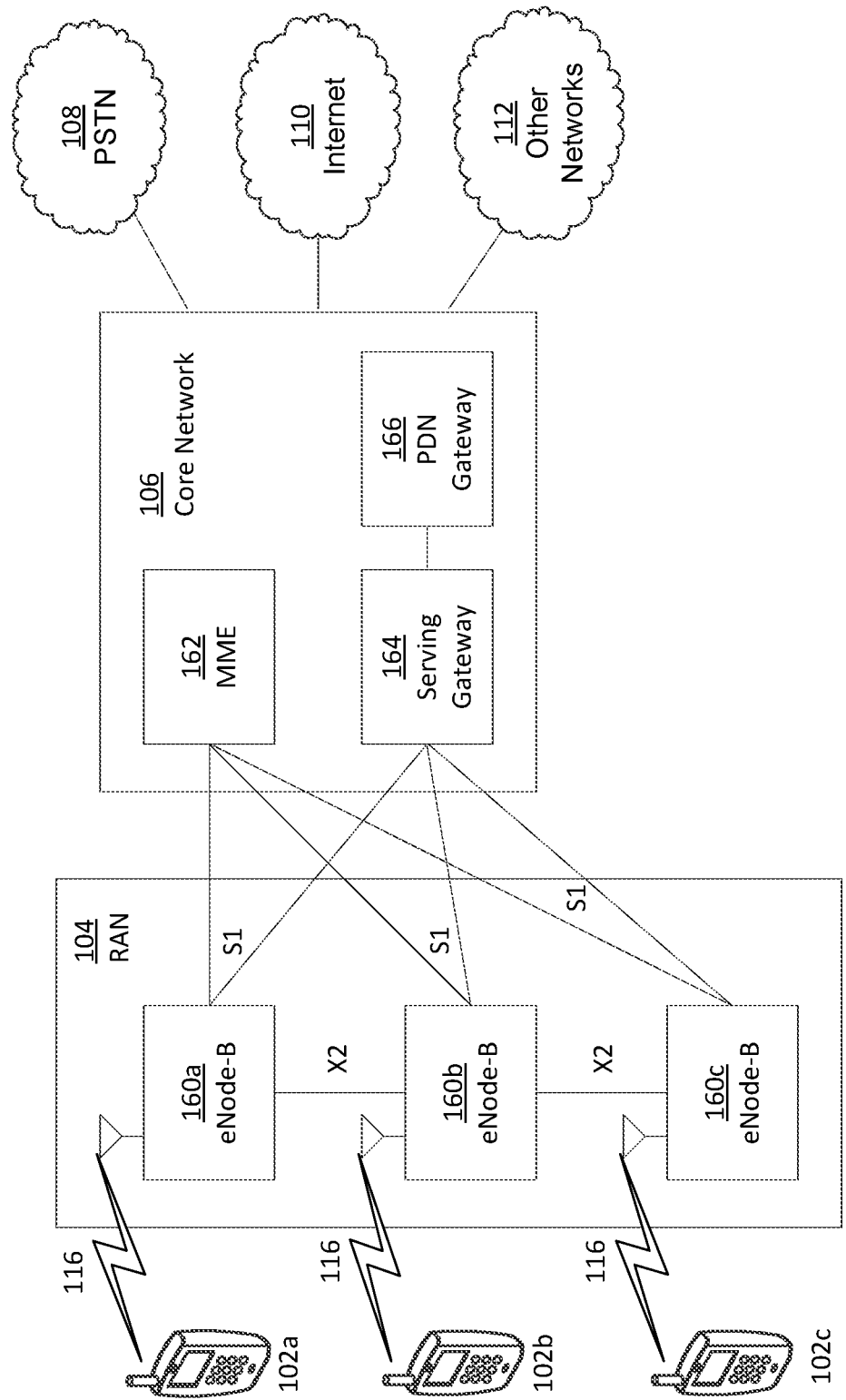
FIG. 1C is a system diagram illustrating an example radio access network (RAN) and an example core network (CN) that may be used within the communications system illustrated in FIG. 1A according to an embodiment.

FIG. 1C is a system diagram illustrating the RAN 104 and the CN 106 according to an embodiment. As noted above, the RAN 104 may employ an E-UTRA radio technology to communicate with the WTRUs 102a, 102b, 102c over the air interface 116. The RAN 104 may also be in communication with the CN 106.

The RAN 104 may include eNode-Bs 160a, 160b, 160c, though it will be appreciated that the RAN 104 may include any number of eNode-Bs while remaining consistent with an embodiment. The eNode-Bs 160a, 160b, 160c may each include one or more transceivers for communicating with the WTRUs 102a, 102b, 102c over the air interface 116. In one embodiment, the eNode-Bs 160a, 160b, 160c may implement MIMO technology. Thus, the eNode-B 160a, for example, may use multiple antennas to transmit wireless signals to, and/or receive wireless signals from, the WTRU 102a.

Each of the eNode-Bs 160a, 160b, 160c may be associated with a particular cell (not shown) and may be configured to handle radio resource management decisions, handover decisions, scheduling of users in the UL and/or DL, and the like. As shown in FIG. 1C, the eNode-Bs 160a, 160b, 160c may communicate with one another over an X2 interface.

The CN 106 shown in FIG. 1C may include a mobility management entity (MME) 162, a serving gateway (SGW) 164, and a packet data network (PDN) gateway (or PGW) 166. While each of the foregoing elements are depicted as part of the CN 106, it will be appreciated that any of these elements may be owned and/or operated by an entity other than the CN operator.

The MME 162 may be connected to each of the eNode-Bs 162a, 162b, 162c in the RAN 104 via an S1 interface and may serve as a control node. For example, the MME 162 may be responsible for authenticating users of the WTRUs 102a, 102b, 102c, bearer activation/deactivation, selecting a particular serving gateway during an initial attach of the WTRUs 102a, 102b, 102c, and the like. The MME 162 may provide a control plane function for switching between the RAN 104 and other RANs (not shown) that employ other radio technologies, such as GSM and/or WCDMA.

The SGW 164 may be connected to each of the eNode Bs 160a, 160b, 160c in the RAN 104 via the S1 interface. The SGW 164 may generally route and forward user data packets to/from the WTRUs 102a, 102b, 102c. The SGW 164 may perform other functions, such as anchoring user planes during inter-eNode B handovers, triggering paging when DL data is available for the WTRUs 102a, 102b, 102c, managing and storing contexts of the WTRUs 102a, 102b, 102c, and the like.

The SGW 164 may be connected to the PGW 166, which may provide the WTRUs 102a, 102b, 102c with access to packet-switched networks, such as the Internet 110, to facilitate communications between the WTRUs 102a, 102b, 102c and IP-enabled devices.

The CN 106 may facilitate communications with other networks. For example, the CN 106 may provide the WTRUs 102a, 102b, 102c with access to circuit-switched networks, such as the PSTN 108, to facilitate communications between the WTRUs 102a, 102b, 102c and traditional land-line communications devices. For example, the CN 106 may include, or may communicate with, an IP gateway (e.g., an IP multimedia subsystem (IMS) server) that serves as an interface between the CN 106 and the PSTN 108. In addition, the CN 106 may provide the WTRUs 102a, 102b, 102c with access to the other networks 112, which may include other wired and/or wireless networks that are owned and/or operated by other service providers.

Although the WTRU is described in FIGS. 1A-1D as a wireless terminal, it is contemplated that in certain representative embodiments that such a terminal may use (e.g., temporarily or permanently) wired communication interfaces with the communication network.

In representative embodiments, the other network 112 may be a WLAN.

A WLAN in Infrastructure Basic Service Set (BSS) mode may have an Access Point (AP) for the BSS and one or more stations (STAs) associated with the AP. The AP may have an access or an interface to a Distribution System (DS) or another type of wired/wireless network that carries traffic in to and/or out of the BSS. Traffic to STAs that originates from outside the BSS may arrive through the AP and may be delivered to the STAs. Traffic originating from STAs to destinations outside the BSS may be sent to the AP to be delivered to respective destinations. Traffic between STAs within the BSS may be sent through the AP, for example, where the source STA may send traffic to the AP and the AP may deliver the traffic to the destination STA. The traffic between STAs within a BSS may be considered and/or referred to as peer-to-peer traffic. The peer-to-peer traffic may be sent between (e.g., directly between) the source and destination STAs with a direct link setup (DLS). In certain representative embodiments, the DLS may use an 802.11e DLS or an 802.11z tunneled DLS (TDLS). A WLAN using an Independent BSS (IBSS) mode may not have an AP, and the STAs (e.g., all of the STAs) within or using the IBSS may communicate directly with each other. The IBSS mode of communication may sometimes be referred to herein as an "ad-hoc" mode of communication.

When using the 802.11ac infrastructure mode of operation or a similar mode of operations, the AP may transmit a beacon on a fixed channel, such as a primary channel. The primary channel may be a fixed width (e.g., 20 MHz wide bandwidth) or a dynamically set width via signaling. The primary channel may be the operating channel of the BSS and may be used by the STAs to establish a connection with the AP. In certain representative embodiments, Carrier Sense Multiple Access with Collision Avoidance (CSMA/CA) may be implemented, for example in in 802.11 systems. For CSMA/CA, the STAs (e.g., every STA), including the AP, may sense the primary channel. If the primary channel is sensed/detected and/or determined to be busy by a particular STA, the particular STA may back off. One STA (e.g., only one station) may transmit at any given time in a given BSS.

High Throughput (HT) STAs may use a 40 MHz wide channel for communication, for example, via a combination of the primary 20 MHz channel with an adjacent or nonadjacent 20 MHz channel to form a 40 MHz wide channel.

Very High Throughput (VHT) STAs may support 20 MHz, 40 MHz, 80 MHz, and/or 160 MHz wide channels. The 40 MHz, and/or 80 MHz, channels may be formed by combining contiguous 20 MHz channels. A 160 MHz channel may be formed by combining 8 contiguous 20 MHz channels, or by combining two non-contiguous 80 MHz channels, which may be referred to as an 80+80 configuration. For the 80+80 configuration, the data, after channel encoding, may be passed through a segment parser that may divide the data into two streams. Inverse Fast Fourier Transform (IFFT) processing, and time domain processing, may be done on each stream separately. The streams may be mapped on to the two 80 MHz channels, and the data may be transmitted by a transmitting STA. At the receiver of the receiving STA, the above described operation for the 80+80 configuration may be reversed, and the combined data may be sent to the Medium Access Control (MAC).

Sub 1 GHz modes of operation are supported by 802.11af and 802.11ah. The channel operating bandwidths, and carriers, are reduced in 802.11af and 802.11ah relative to those used in 802.11n, and 802.11ac. 802.11af supports 5 MHz, 10 MHz and 20 MHz bandwidths in the TV White Space (TVWS) spectrum, and 802.11ah supports 1 MHz, 2 MHz, 4 MHz, 8 MHz, and 16 MHz bandwidths using non-TVWS spectrum. According to a representative embodiment, 802.11ah may support Meter Type Control/Machine-Type Communications, such as MTC devices in a macro coverage area. MTC devices may have certain capabilities, for example, limited capabilities including support for (e.g., only support for) certain and/or limited bandwidths. The MTC devices may include a battery with a battery life above a threshold (e.g., to maintain a very long battery life).

WLAN systems, which may support multiple channels, and channel bandwidths, such as 802.11n, 802.11ac, 802.11af, and 802.11ah, include a channel which may be designated as the primary channel. The primary channel may have a bandwidth equal to the largest common operating bandwidth supported by all STAs in the BSS. The bandwidth of the primary channel may be set and/or limited by a STA, from among all STAs in operating in a BSS, which supports the smallest bandwidth operating mode. In the example of 802.11ah, the primary channel may be 1 MHz wide for STAs (e.g., MTC type devices) that support (e.g., only support) a 1 MHz mode, even if the AP, and other STAs in the BSS support 2 MHz, 4 MHz, 8 MHz, 16 MHz, and/or other channel bandwidth operating modes. Carrier sensing and/or Network Allocation Vector (NAV) settings may depend on the status of the primary channel. If the primary channel is busy, for example, due to a STA (which supports only a 1 MHz operating mode), transmitting to the AP, the entire available frequency bands may be considered busy even though a majority of the frequency bands remains idle and may be available.

In the United States, the available frequency bands, which may be used by 802.11ah, are from 902 MHz to 928 MHz. In Korea, the available frequency bands are from 917.5 MHz to 923.5 MHz. In Japan, the available frequency bands are from 916.5 MHz to 927.5 MHz. The total bandwidth available for 802.11ah is 6 MHz to 26 MHz depending on the country code.

Figure 1D:
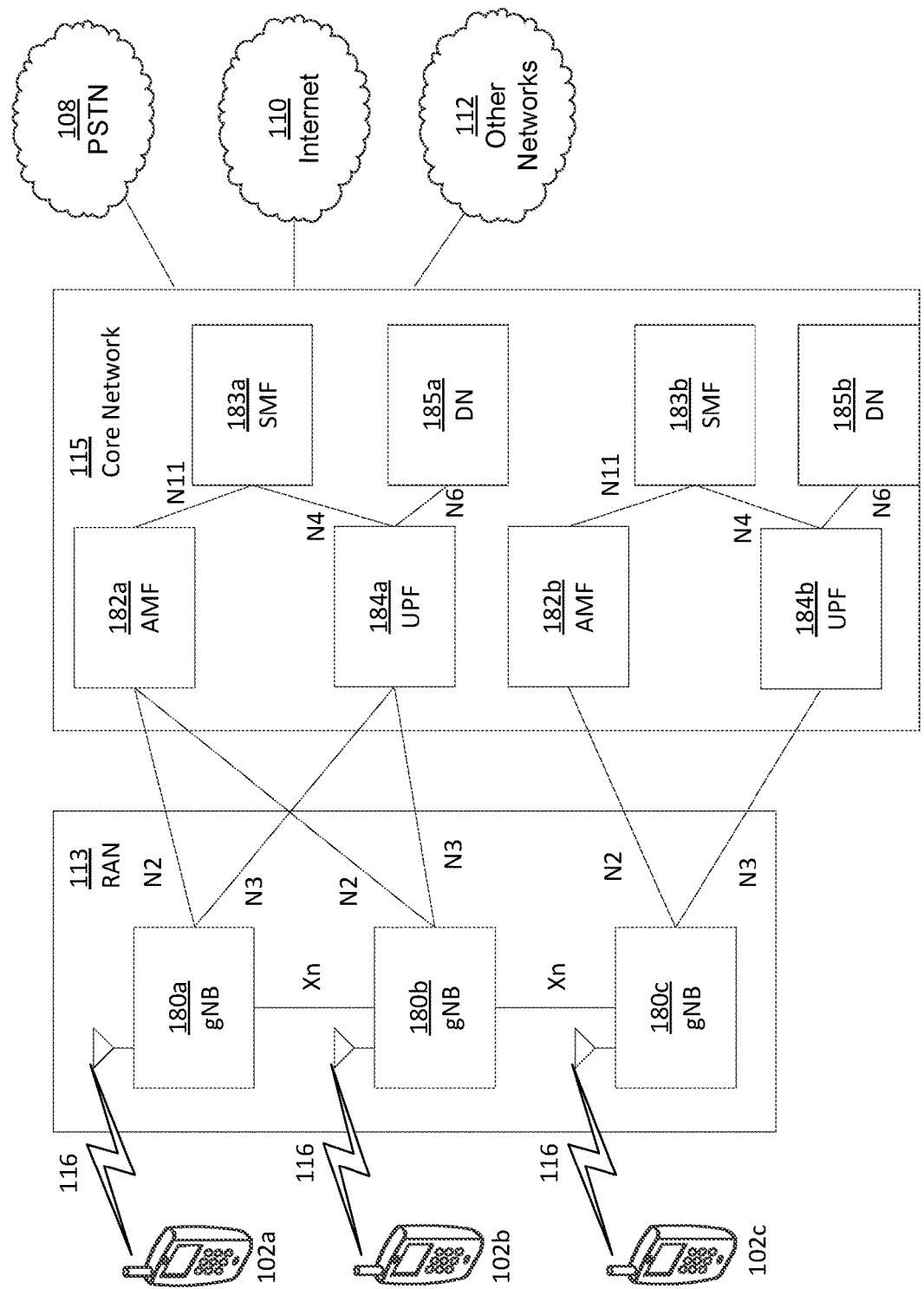
FIG. 1D is a system diagram illustrating a further example RAN and a further example CN that may be used within the communications system illustrated in FIG. 1A according to an embodiment.

FIG. 1D is a system diagram illustrating the RAN 113 and the CN 115 according to an embodiment. As noted above, the RAN 113 may employ an NR radio technology to communicate with the WTRUs 102a, 102b, 102c over the air interface 116. The RAN 113 may also be in communication with the CN 115.

The RAN 113 may include gNBs 180a, 180b, 180c, though it will be appreciated that the RAN 113 may include any number of gNBs while remaining consistent with an embodiment. The gNBs 180a, 180b, 180c may each include one or more transceivers for communicating with the WTRUs 102a, 102b, 102c over the air interface 116. In one embodiment, the gNBs 180a, 180b, 180c may implement MIMO technology. For example, gNBs 180a, 108b may utilize beamforming to transmit signals to and/or receive signals from the gNBs 180a, 180b, 180c. Thus, the gNB 180a, for example, may use multiple antennas to transmit wireless signals to, and/or receive wireless signals from, the WTRU 102a. In an embodiment, the gNBs 180a, 180b, 180c may implement carrier aggregation technology. For example, the gNB 180a may transmit multiple component carriers to the WTRU 102a (not shown). A subset of these component carriers may be on unlicensed spectrum while the remaining component carriers may be on licensed spectrum. In an embodiment, the gNBs 180a, 180b, 180c may implement Coordinated Multi-Point (CoMP) technology. For example, WTRU 102a may receive coordinated transmissions from gNB 180a and gNB 180b (and/or gNB 180c).

The WTRUs 102a, 102b, 102c may communicate with gNBs 180a, 180b, 180c using transmissions associated with a scalable numerology. For example, the OFDM symbol spacing and/or OFDM subcarrier spacing may vary for different transmissions, different cells, and/or different portions of the wireless transmission spectrum. The WTRUs 102a, 102b, 102c may communicate with gNBs 180a, 180b, 180c using subframe or transmission time intervals (TTIs) of various or scalable lengths (e.g., containing varying number of OFDM symbols and/or lasting varying lengths of absolute time).

The gNBs 180a, 180b, 180c may be configured to communicate with the WTRUs 102a, 102b, 102c in a standalone configuration and/or a non-standalone configuration. In the standalone configuration, WTRUs 102a, 102b, 102c may communicate with gNBs 180a, 180b, 180c without also accessing other RANs (e.g., such as eNode-Bs 160a, 160b, 160c). In the standalone configuration, WTRUs 102a, 102b, 102c may utilize one or more of gNBs 180a, 180b, 180c as a mobility anchor point. In the standalone configuration, WTRUs 102a, 102b, 102c may communicate with gNBs 180a, 180b, 180c using signals in an unlicensed band. In a non-standalone configuration WTRUs 102a, 102b, 102c may communicate with/connect to gNBs 180a, 180b, 180c while also communicating with/connecting to another RAN such as eNode-Bs 160a, 160b, 160c. For example, WTRUs 102a, 102b, 102c may implement DC principles to communicate with one or more gNBs 180a, 180b, 180c and one or more eNode-Bs 160a, 160b, 160c substantially simultaneously. In the non-standalone configuration, eNode-Bs 160a, 160b, 160c may serve as a mobility anchor for WTRUs 102a, 102b, 102c and gNBs 180a, 180b, 180c may provide additional coverage and/or throughput for servicing WTRUs 102a, 102b, 102c.

Each of the gNBs 180a, 180b, 180c may be associated with a particular cell (not shown) and may be configured to handle radio resource management decisions, handover decisions, scheduling of users in the UL and/or DL, support of network slicing, dual connectivity, interworking between NR and E-UTRA, routing of user plane data towards User Plane Function (UPF) 184a, 184b, routing of control plane information towards Access and Mobility Management Function (AMF) 182a, 182b and the like. As shown in FIG. 1D, the gNBs 180a, 180b, 180c may communicate with one another over an Xn interface.

The CN 115 shown in FIG. 1D may include at least one AMF 182a, 182b, at least one UPF 184a,184b, at least one Session Management Function (SMF) 183a, 183b, and possibly a Data Network (DN) 185a, 185b. While each of the foregoing elements are depicted as part of the CN 115, it will be appreciated that any of these elements may be owned and/or operated by an entity other than the CN operator.

The AMF 182a, 182b may be connected to one or more of the gNBs 180a, 180b, 180c in the RAN 113 via an N2 interface and may serve as a control node. For example, the AMF 182a, 182b may be responsible for authenticating users of the WTRUs 102a, 102b, 102c, support for network slicing (e.g., handling of different PDU sessions with different requirements), selecting a particular SMF 183a, 183b, management of the registration area, termination of NAS signaling, mobility management, and the like. Network slicing may be used by the AMF 182a, 182b in order to customize CN support for WTRUs 102a, 102b, 102c based on the types of services being utilized WTRUs 102a, 102b, 102c. For example, different network slices may be established for different use cases such as services relying on ultra-reliable low latency (URLLC) access, services relying on enhanced massive mobile broadband (eMBB) access, services for machine type communication (MTC) access, and/or the like. The AMF 162 may provide a control plane function for switching between the RAN 113 and other RANs (not shown) that employ other radio technologies, such as LTE, LTE-A, LTE-A Pro, and/or non-3GPP access technologies such as WiFi.

The SMF 183a, 183b may be connected to an AMF 182a, 182b in the CN 115 via an N11 interface. The SMF 183a, 183b may also be connected to a UPF 184a, 184b in the CN 115 via an N4 interface. The SMF 183a, 183b may select and control the UPF 184a, 184b and configure the routing of traffic through the UPF 184a, 184b. The SMF 183a, 183b may perform other functions, such as managing and allocating UE IP address, managing PDU sessions, controlling policy enforcement and QoS, providing downlink data notifications, and the like. A PDU session type may be IP-based, non-IP based, Ethernet-based, and the like.

The UPF 184a, 184b may be connected to one or more of the gNBs 180a, 180b, 180c in the RAN 113 via an N3 interface, which may provide the WTRUs 102a, 102b, 102c with access to packet-switched networks, such as the Internet 110, to facilitate communications between the WTRUs 102a, 102b, 102c and IP-enabled devices. The UPF 184, 184b may perform other functions, such as routing and forwarding packets, enforcing user plane policies, supporting multi-homed PDU sessions, handling user plane QoS, buffering downlink packets, providing mobility anchoring, and the like.

The CN 115 may facilitate communications with other networks. For example, the CN 115 may include, or may communicate with, an IP gateway (e.g., an IP multimedia subsystem (IMS) server) that serves as an interface between the CN 115 and the PSTN 108. In addition, the CN 115 may provide the WTRUs 102a, 102b, 102c with access to the other networks 112, which may include other wired and/or wireless networks that are owned and/or operated by other service providers. In one embodiment, the WTRUs 102a, 102b, 102c may be connected to a local Data Network (DN) 185a, 185b through the UPF 184a, 184b via the N3 interface to the UPF 184a, 184b and an N6 interface between the UPF 184a, 184b and the DN 185a, 185b.

In view of FIGS. 1A-1D, and the corresponding description of FIGS. 1A-1D, one or more, or all, of the functions described herein with regard to one or more of: WTRU 102a-d, Base Station 114a-b, eNode-B 160a-c, MME 162, SGW 164, PGW 166, gNB 180a-c, AMF 182a-ab, UPF 184a-b, SMF 183a-b, DN 185a-b, and/or any other device (s) described herein, may be performed by one or more emulation devices (not shown). The emulation devices may be one or more devices configured to emulate one or more, or all, of the functions described herein. For example, the emulation devices may be used to test other devices and/or to simulate network and/or WTRU functions.

The emulation devices may be designed to implement one or more tests of other devices in a lab environment and/or in an operator network environment. For example, the one or more emulation devices may perform the one or more, or all, functions while being fully or partially implemented and/or deployed as part of a wired and/or wireless communication network in order to test other devices within the communication network. The one or more emulation devices may perform the one or more, or all, functions while being temporarily implemented/deployed as part of a wired and/or wireless communication network. The emulation device may be directly coupled to another device for purposes of testing and/or may performing testing using over-the-air wireless communications.

The one or more emulation devices may perform the one or more, including all, functions while not being implemented/deployed as part of a wired and/or wireless communication network. For example, the emulation devices may be utilized in a testing scenario in a testing laboratory and/or a non-deployed (e.g., testing) wired and/or wireless communication network in order to implement testing of one or more components. The one or more emulation devices may be test equipment. Direct RF coupling and/or wireless communications via RF circuitry (e.g., which may include one or more antennas) may be used by the emulation devices to transmit and/or receive data.

Use cases for emerging 5G systems may include Enhanced Mobile Broadband (eMBB), Massive Machine Type Communications (mMTC) and Ultra Reliable and Low latency Communications (URLLC). Different use cases may focus on different requirements such as higher data rate, higher spectrum efficiency, low power and higher energy efficiency, lower latency, and/or higher reliability.

Acquisition of control information may be important for 5G new radio (NR). Efficient and reliable delivery of control information may be desirable. Unreliable control information may impact the performance, data rate, latency, and/or MIMO system operations. If acquisition of scheduling grant is not reliable, latency and retransmission of Hybrid-ARQ (HARQ) and/or scheduling time may be affected. If acquisition of CQI is not reliable, scheduling, link adaptation, and/or MCS may be impacted. When acquisition of ACK/NACK is not reliable, HARQ may be impacted. If RI/PMI is not reliable, MIMO operation and/or performance may be impacted.

Polar codes may be capacity achieving codes (e.g., similar to turbo codes and LDPC codes). Polar codes may include linear block codes, with low encoding and/or decoding complexity, a low error or no error floor, and explicit construction.

Consider a (N, K) polar code, where K is the information block length and N is coded block length. The value of N may be set as a power of 2, e.g., $N=2^n$ for some integer n. A polar code may be a linear block code. A generator matrix of a polar code may be expressed by $G_N = B_N F^{\otimes n}$, where $B_N$ is the bit-reversal permutation matrix, $(.)^{\otimes n}$ denotes the n-th Kronecker power, and $$F = \begin{bmatrix} 1 & 0 \\ 1 & 1 \end{bmatrix}.$$

In an implementation of polar codes, the $B_N$ may be ignored at the encoder side (e.g., for simplicity) and the bit-reversal operation may be performed at the decoder side.

Figure 2:
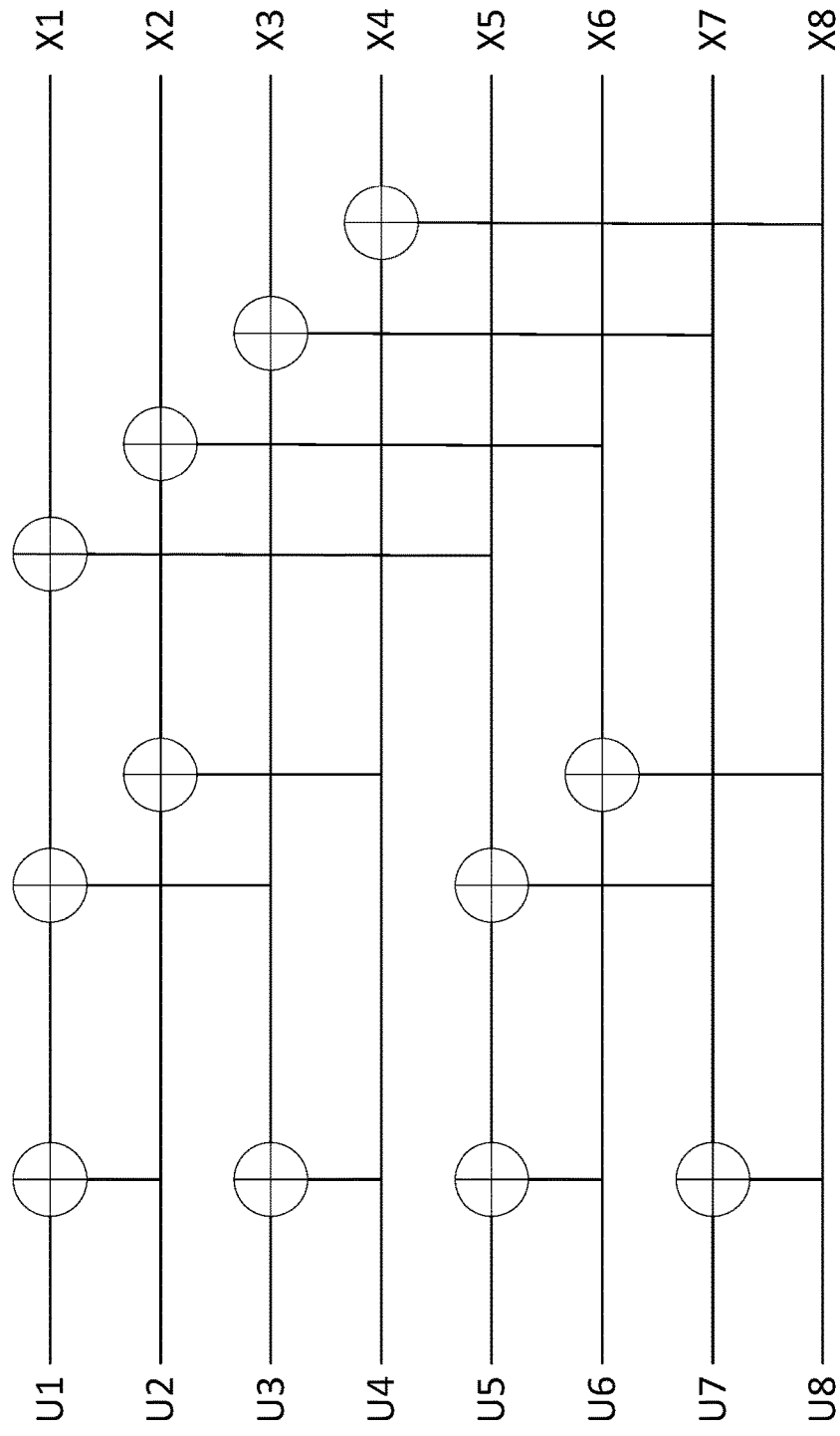
FIG. 2 depicts an example polar encoder with N=8.

FIG. 2 depicts an example polar encoder 200 with N=8. As shown in FIG. 2, N=8 may represent the implementation of $F^{\otimes 3}$. A codeword of polar code may be given by $x_1^N = u_1^N G_N$.

Polar coding may include Successive Cancellation (SC) decoding. Polar coding may include Successive Cancellation List (SCL) decoding and/or CRC-Aided SCL decoding.

Polar codes may be well structured in terms of encoding and decoding. The effectiveness of a polar code design may depend on a mapping of K information bits to N input bits of the polar encoder $u_1^N$. The K information bits may be assigned to the K best bit channels. The remaining N−K input bits which are not mapped from the information bits may be frozen bits. A frozen bit may be generally set as 0. A set of the positions for frozen bits may be called frozen set $\mathcal{F}$.

A decision on the best bit channels may vary and/or depend on channel conditions. Bit channels may be ranked based on reliability (e.g., to determine a set of frozen channels). One or more reliable bit channels may be determined to be good bit channels and one or more less reliable bit channels may be determined to be bad bit channels.

Reliability of a bit channel may be calculated, for example, using one or more of Bhattacharyya bounds, a Monte-Carlo estimation, a full transition probability matrices estimation, or a Gaussian approximation. Calculating reliability of a bit channel may be associated with different computation complexity and/or may apply to different channel conditions. A design SNR parameter may be selected before starting the reliability calculation.

Puncturing and/or rate matching may be performed in polar coding. An output of a polar encoder may be a power of 2, which may impose a polar coding restriction. A length of information bits (K) and/or a coding rate (R) may be predetermined. A codeword block length may be determined as $$\frac{K}{R}.$$

The codework block length may not be a power of 2. Some puncturing of the output bits may be executed from the smallest number larger than $$\frac{K}{R},$$

which is a power of 2. For example, when K=100 bits and $$R = \frac{1}{3},$$

an output codeword length may be expected to be 300 bits. 512 bits may be generated by a polar encoder and 212 bits may be punctured from the 512 bits.

Figure 3:
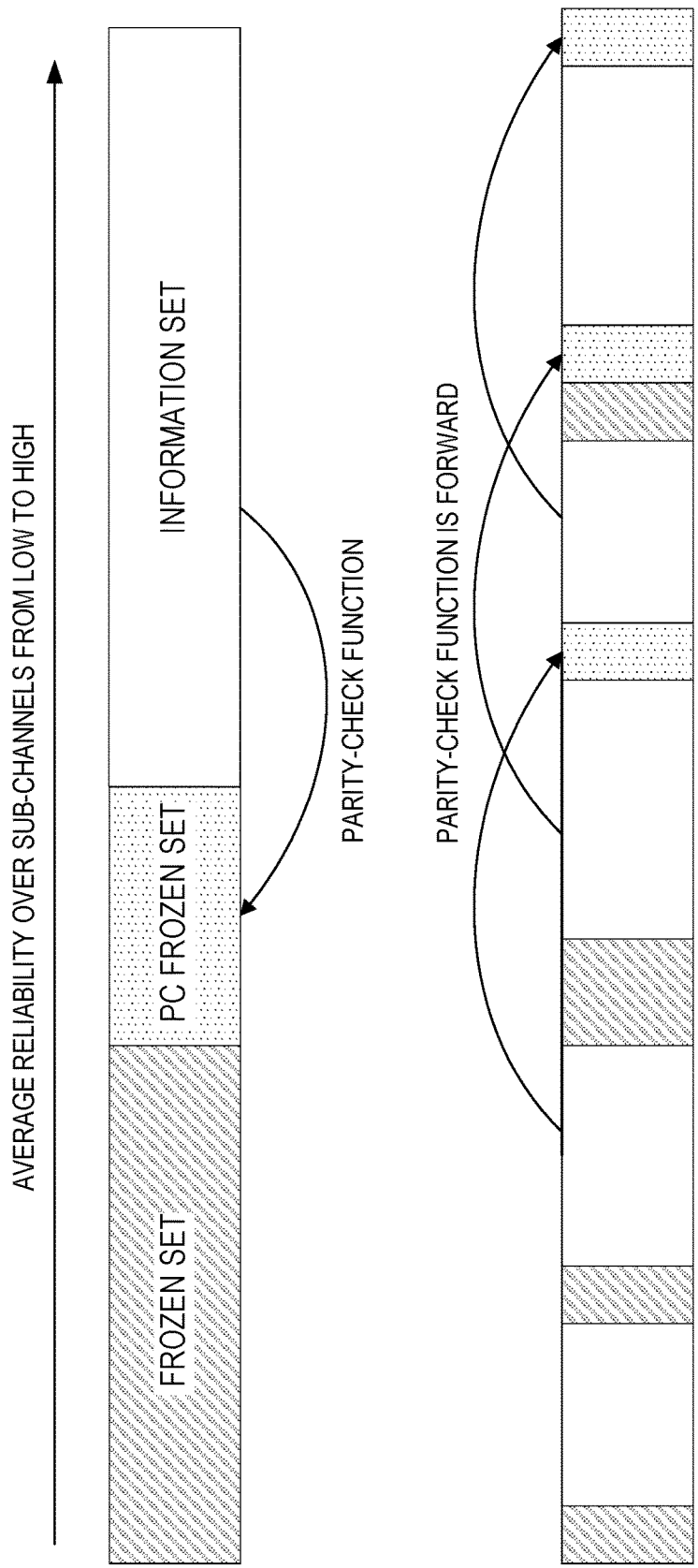
FIG. 3 depicts an example PC polar code.

A Parity Check (PC) polar code and/or CRC-aided (CA) polar code may be provided. The PC polar code may differ from a polar code. For example, in a PC polar code, a subset of a frozen sub-channel set may be selected as PC-frozen sub-channels. A PC function may be established over the selected PC frozen sub-channels (e.g., for error correction). At each parity check sub-channel position, the decoded bits involved in the PC function over a PC-frozen sub-channel may help prune the list decoding tree. For example, only the paths that meet the PC-function may survive, the rest of the paths may be eliminated, e.g., on the fly. The PC function may be established as forward-only to be consistent with any successive cancellation-based decoder. FIG. 3 depicts an example PC polar code 300.

Figure 4:
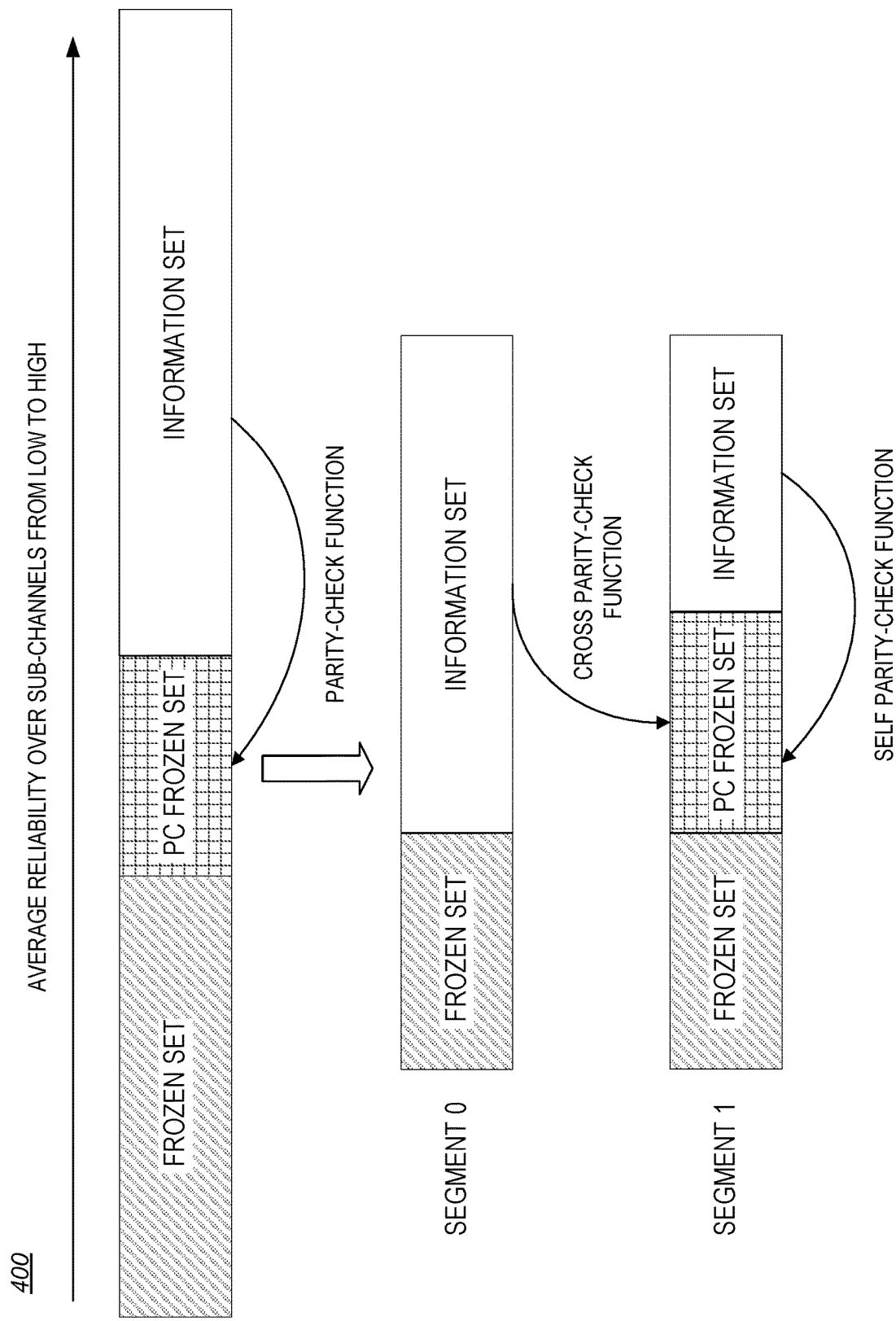
FIG. 4 depicts an example concatenated PC polar code with 2 parallel segments.

A chained polar code may be provided. In a chained polar code, a long codeword may be divided into two or more shorter codeword segments and the codeword segments may be decoded in parallel. FIG. 4 depicts an example concatenated PC polar code 400 with 2 parallel segments. As shown, a first segment may not include a PC frozen bit set, while a second segment may include the PC frozen bit set. A cross-parity-check function may be used for the first segment (e.g., as the PC frozen bit set is in the second segment). A self-parity-check function may be used for the second segment. Both the self-parity-check function and the cross-parity-check function may be forward-only functions such that the successive cancellation nature of the polar decoder may be maintained.

The concatenated polar code may be able to reduce the decoding latency because segments can be decoded in parallel. If rate matching is needed for the codeword, the concatenated polar code may improve the performance of polar codes (e.g., as it could avoid deep puncturing of the mother codewords, which may lead to performance degrade).

Acquisition of control information may be important for a 5G NR. Efficient and/or reliable delivery of control information may be desirable. Unreliable control information may adversely impact the performance, data rate, latency, and/or MIMO system operations. If acquisition of a scheduling grant is not reliable, latency, retransmission of Hybrid-ARQ (HARQ), and/or scheduling time may be affected (e.g., adversely). If acquisition of CQI is not reliable, scheduling, link adaptation, and/or MCS may be affected. When acquisition of ACK/NACK is not reliable, it affects HARQ and throughput. When acquisition of RI/PMI is not reliable, MIMO operation, performance, data rates, and/or throughput may be affected (e.g., adversely).

Priority-based channel coding for control information may be used when a large amount of control information for 5G and/or new radio (NR) requires more efficient coding for a control channel. Priority-based channel coding for control information may be used when control information needs to be transmitted and/or reported jointly and simultaneously.

Priority-based channel coding for control information may be used when different control information has different importance levels. Control information may include control messages, control message fields, control information fields, and/or the like. Control information may be associated with a plurality of control information types. Each control information type may be associated with a respective priority.

Priority-based channel coding for control information may be used when different bits in a control message/field have different importance levels.

Priority-based channel coding for control information may be performed when priority-based jointly encoded uplink control information is transmitted for WTRU feedback.

A WTRU may be configured to perform joint coding of multiple control information using a Polar code for a control channel in the uplink. A base station (e.g., gNB, eNB, AP, etc.) may be configured to perform joint coding of multiple control information using a polar code for a control channel in the downlink.

Priority may be predefined and/or configured for control information. For example, if priority is predefined, a WTRU may prioritize control information based on the predefined priority and/or one or more priority rules. If priority is configured, a WTRU may receive an indication to prioritize control information based on an indicated priority and/or one or more priority rules. Different priorities and/or priority rules may be applied to control information at different levels. For example, different priorities and/or priority rules may be applied to control information, control information types, control messages, instances of control information, control fields, control message fields, bit fields, control bits, and/or other types of control information.

A WTRU may be configured to perform a prioritization procedure for control information that is to be joint coded with other control information in the uplink. A base station (e.g., gNB, eNB, AP, etc.) may be configured to perform a prioritization procedure for control information that is to be joint coded with other control information in the downlink. For example, a WTRU and/or a base station may prioritize control information.

A WTRU may be configured to prioritize control information for example, at a bit level, for joint coding in the uplink. A base station (e.g., gNB, eNB, AP, etc.) may be configured to prioritize control information for example, at a bit level, for joint coding in the downlink.

A WTRU may be configured to perform a hybrid and/or joint prioritization of control information and bit level control information, for example, for joint coding in the uplink. A base station (e.g., gNB, eNB, AP, etc.) may be configured to perform a hybrid and/or joint prioritization of control information and bit level control information, for example, for joint coding in the downlink. For example, a WTRU and/or a base station may prioritize control information and bit level control information jointly.

Jointly encoded and prioritized control information may be transmitted. Examples described herein may be described with respect to one of the uplink or downlink, but the examples may apply to the uplink and downlink.

Joint coding of control information may include using a polar code for a control channel. The control information may include multiple parts. For example, the control information may include multiple instances of control information. The instances of control information may include one or more control messages and/or one or more control message fields. The instances of control information may be associated with a plurality of control information types. The control information types may include one or more of synchronization signal (SS) block index (SSBI), rank indicator (RI), precoding matrix indicator (PMI), channel quality indicator (CQI), CSI-RS resource indicator (CRI), precoder type indicator (PTI), HARQ ACK/NACK, Beam ID, scheduling request (SR), other WTRU feedback information, and/or the like. The control information may be jointly encoded (e.g., to achieve more efficient channel coding and/or maximize the coding gain). Polar coding may outperform other coding schemes such as convolutional codes (e.g., Tail-Biting CC (TBCC) and/or Trellis-Termination CC (TTCC)), LDPC, and/or Turbo codes at small payload sizes (e.g., 20 bits or 40 bits). Polar coding may be suitable for a control channel, which may have a relatively small payload. A control channel may include an uplink control channel, e.g., PUCCH, PUSCH, and/or the like. The uplink control channel may carry uplink control information (UCI) and/or WTRU feedback. A control channel may include a downlink control channel, e.g., PDCCH, E-PDCCH, and/or the like. The downlink control channel may carry downlink control information (DCI). Additional control information may be proposed for NR and may be included in variable size and/or encoded jointly and variably.

Channel coding schemes may be switched (e.g., determined) based on a payload size of a control channel. For example, a first coding scheme (e.g., such as Polar code) may be used when a transmitted payload size of a control channel is larger than a first predefined payload size. A second coding scheme (e.g., such as Reed-Muller code) may be used when a transmitted payload size of a control channel is less than or equal to the first predefined payload size. When the transmitted payload size of a control channel is greater than a second predefined payload size a third coding scheme (e.g., such as LDPC) may be used. The second predefined payload size may be larger than the first predefined payload size. Priority and/or CRC may be used based on a payload size of a control channel. For example, priority and/or CRC may be used for control information and/or a control channel when the transmitted payload size of the control channel is greater than a predefined payload size. Priority and/or CRC may not be used for control information and/or a control channel when the transmitted payload size of the control channel is less than or equal to the predefined payload size.

In an example, there may be J control informations (e.g., instances of control information), each control information may have size $S_j$ bits, $j=1, 2, \ldots, J$. An instance of control information may be associated with a control information type; there may be a plurality of control information types. A total number of control information bits may be represented as K where $K=\Sigma_{j=1}^{J} S_j$. Control information may be jointly encoded using a polar encoder (e.g., with the parameters N,P,K,J,$S_j$,M and R). N may be the code block size, K may be the total control information size, P may be the number of punctured bits, J may be the number of control information, $S_j$ may be the size of control information for control information j, M may be the size of frozen bits, and R may be the code rate. A fixed J and a variable $S_j$ may be used. A variable J and a fixed $S_j$ may be used. Both J and $S_j$ may be variable. Different options may result in different control information report types and report formats. Parameters N, P, K, J, $S_j$, M and R may be input parameters of a code construction component.

A size of control information bits (K) and/or the coding rate (R) may be predetermined.

Joint coding of multiple control information using polar coding for a control channel may include dynamic joint coding, where one or more of the following may apply.

For given values of K and R, an optimum joint coding using polar code may be designed. Control information types and numbers of control information bits may be grouped and/or combined in different ways. Different coding designs may be needed to accommodate different values of K and R or different values of K for a given value of R. For example, if a code rate 1/3 is predetermined, when K changes, N and P may change to maintain a fixed R. If N is fixed, a puncture value P may change to maintain the code rate 1/3, e.g., $$R = \frac{k}{N'}$$

where N'=N−P. The coding rate, $$R = \frac{k}{N'}$$

may be varied by design where N' represents the number of coded bits after puncturing. For a target code rate, the size of control information may be dynamic, for example, by adjusting P and/or N to meet the target code rate. Control information may be dynamically combined.

Multiple smaller sized polar codes may be combined. The multiple smaller sized polar codes may be combined to generate a desired coded bit output length. The desired coded bit output length may be a predetermined coded bit output length. For instance, a first code word of a polar code with a first length (e.g., 8 bits) may be combined with a second code word of a polar code with a second length (e.g., 4 bits) and may generate a combined code word with a third length (e.g., 12 bits). The multiple smaller sized polar codes may be used to encode control information and/or WTRU feedback.

In the uplink, a WTRU may be configured to determine whether to perform puncturing of code words and/or whether to combine multiple smaller sized polar codes, for example based on one or more parameters. In the downlink, a base station (e.g., gNB, eNB, AP, etc.) may be configured to determine whether to perform puncturing of code words and/or whether to combine multiple smaller sized polar codes, for example based on one or more parameters. For example, if a number of bits to be punctured is small and/or a ratio of puncturing is smaller than a predetermined threshold, the WTRU and/or base station may determine to perform puncturing. If a number of bits to be punctured is large and/or a ratio of puncturing is larger than or equal to a predetermined threshold, the WTRU and/or base station may determine to combine multiple smaller sized polar codes, for example, to remove the need for heavy puncturing. The one or more parameters may include the number of bits to be punctured, an information block length, a coded block length, a decoding algorithm, a polar code type, and/or the like.

Joint coding of multiple control information using polar coding for a control channel may include a worst case joint coding. For given values of N, P, and code rate $\leq R_{max}$, the worst case joint coding using Polar code may be designed. For example, a maximum code rate $R_{max}=1/3$ may be predetermined for minimum performance requirements. K may not be allowed to exceed a certain threshold if N and P are not changed. If N and P are fixed, a code rate may increase with K. K may be designed such that $K \leq K_{max}=(N-P) \cdot R_{max}$. When $K=K_{max}$, a maximum code rate $R_{max}=1/3$ may be achieved, which may maintain the minimum coding performance requirements without performance degradation. When $K<K_{max}$, code rate may be smaller than a maximum code rate $R_{max}$, e.g., code rate <1/3 which exceeds the minimum requirements and enhances the bit error performance. A size of control information may be controlled to be equal to or less than $K_{max}$ bits for a predetermined maximum code rate. Preset combinations of control information may be designed to meet a $K_{max}$ requirement and/or a corresponding $R_{max}$ requirement.

A Code Construction component based on parameters J and $S_j$ may be used to compute K. A Code Construction component based on N, P and K may be used to allocate the size (e.g., proper size) of input and output of Polar encoder as well as the location for the output bits where the output bits should be received. A Code Construction component may generate one or more frozen bits and may instruct a polar encoder to jointly encode the control information.

Figure 5:
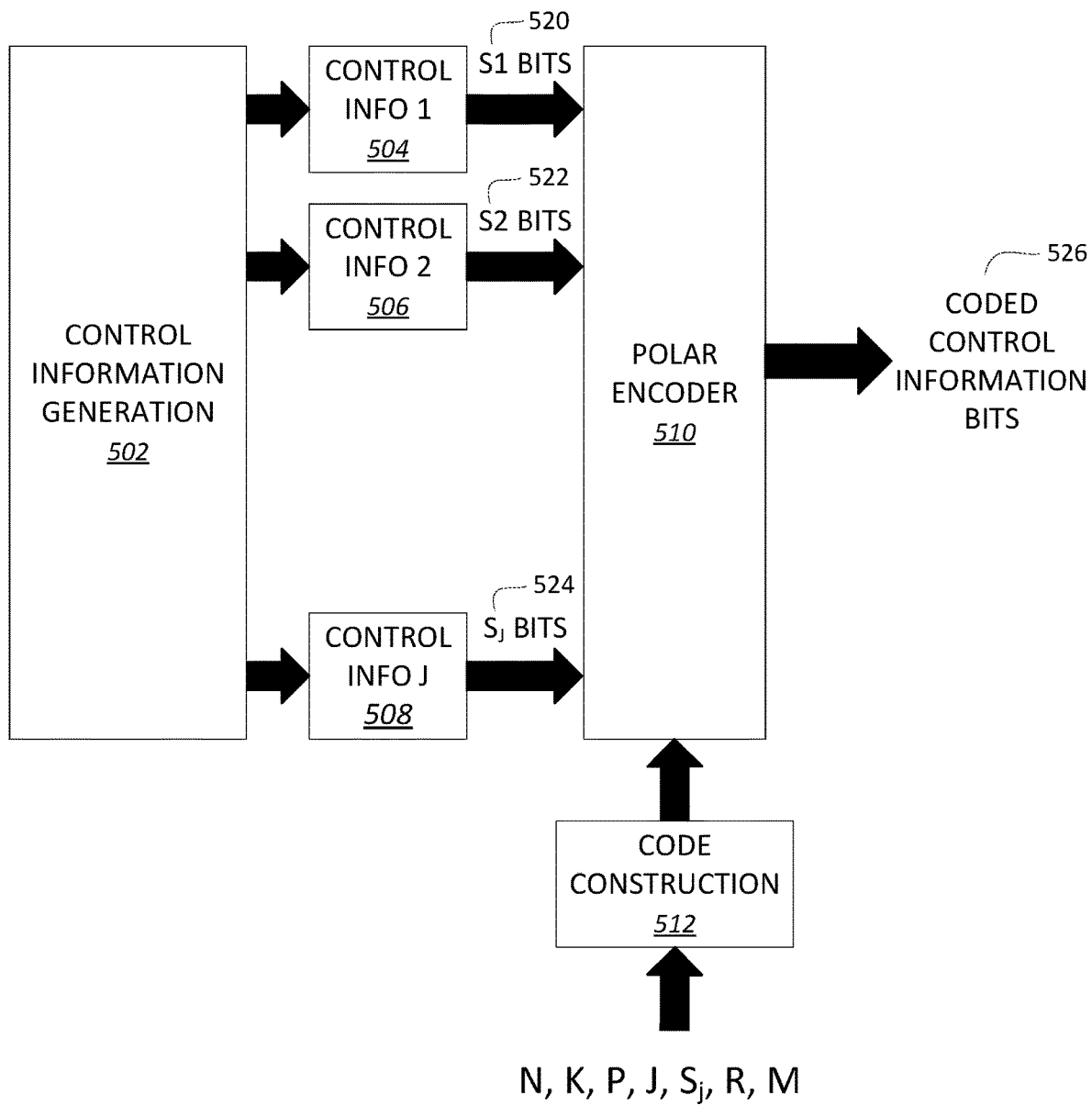
FIG. 5 depicts an example joint coding of multiple control information using polar coding.

FIG. 5 depicts an example joint coding 500 of multiple control information using polar coding. For example, a variable joint coding of multiple control information may use polar coding for a control channel. At 502, various control information may be generated (e.g., multiple instances comprising a plurality of types). First control information (e.g., such as control info 1 504), second control information (e.g., such as control info 2 506), and third control information (e.g., such as control info J 508) may be generated and may be sent to a polar encoder 510. Control info 1 504 may include a first set of bits (e.g., S1 bits 520). Control info 2 506 may include a second set of bits (e.g., S2 bits 522). Control info J 508 may include a J-th set of bits (e.g., $S_J$ bits 524). The polar encoder 510 may generate coded control information bits 526 based on the first, second, and/or J-th set of bits. For example, the control information (e.g., S1 bits 520, S2 bits 522, $S_J$ bits 524) may be polar encoded using a code construction 512. Rate matching may be performed for the polar coded control information bits 526.

Control information types may be prioritized for joint coding. Control information may include one or more control fields. Control fields may be prioritized for joint coding. Control information prioritization for joint coding of multiple control information with different control types, fields, etc. for a control channel may be performed.

Control information, control messages, and/or control fields may be prioritized at a control information level and/or a control field level across multiple control information or fields. Some control information may be associated with a higher priority than other control information (e.g., for better network performance). For example, one control information type may have a different priority than another control information type, one set of bits associated with a control information type may have a different priority than another set of bits associated with the control information type, etc. Some control fields within the control messages may have a higher priority. A priority-based joint coding of control information and/or control fields using polar coding may address different importance levels of control information and/or control fields. Control information priority sorting, control information grouping, bit channel grouping, bit channel priority mapping and/or selective CRC attachment may be used and/or performed before polar encoding. Rate matching may be performed for Polar encoded bits.

Figure 6:
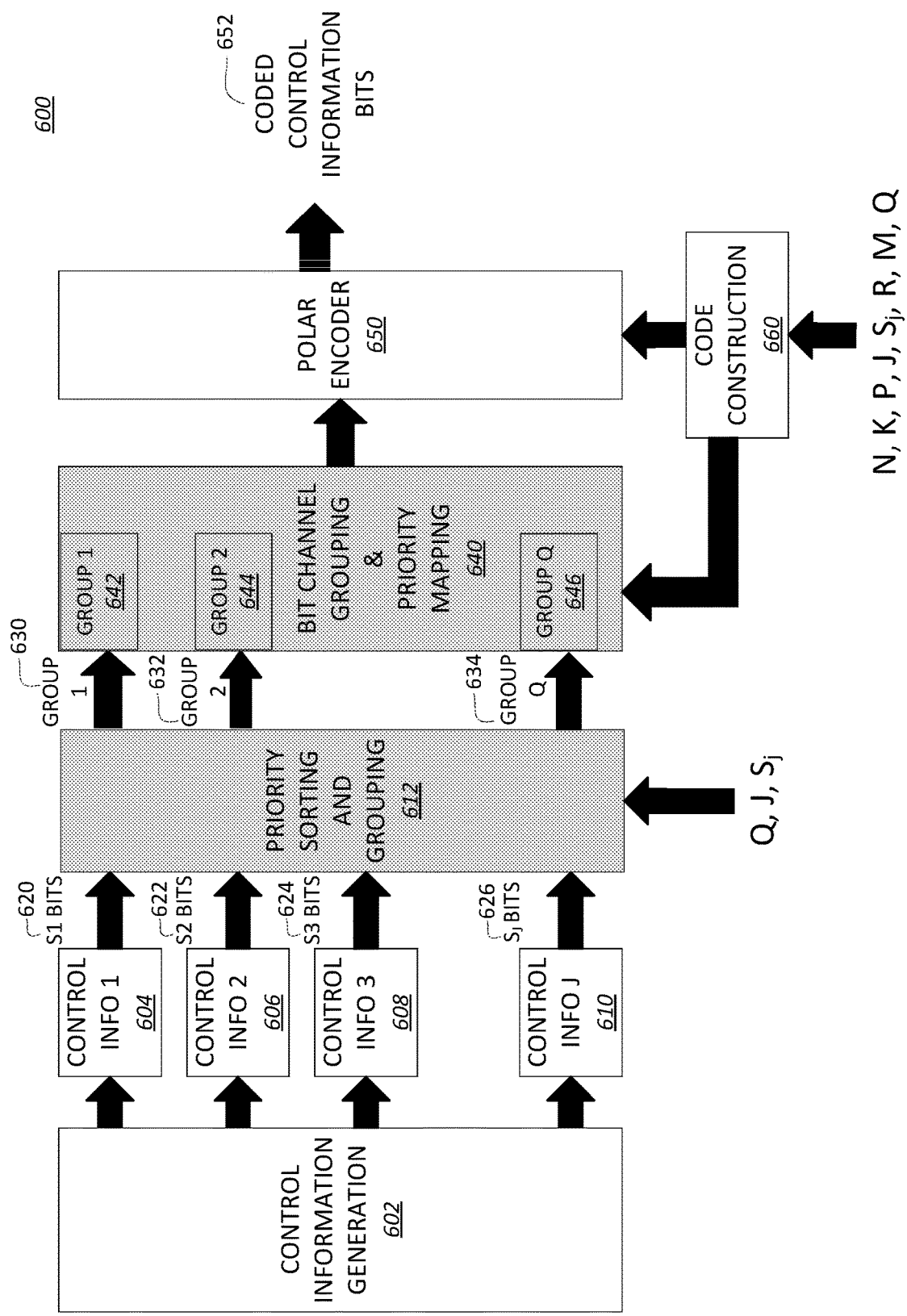
FIG. 6 depicts an example joint coding of control information using polar coding with priority sorting, priority grouping, and bit channel group priority mappings.

FIG. 6 depicts an example joint coding 600 of control information using polar coding with control information priority sorting and grouping and bit channel group priority mappings. At 602, various control information may be generated. First control information (e.g., such as control info 1 604), second control information (e.g., such as control info 2 606), third control information (e.g., such as control info 3 608), and fourth control information (e.g., such as control info J 610) may be generated. The first, second, third, and/or fourth control information may be sorted and/or grouped based on priority. Control info 1 604 may include a first set of bits (e.g., S1 bits 620). Control info 2 606 may include a second set of bits (e.g., S2 bits 622). Control info 3 608 may include a third set of bits (e.g., S3 bits 622). Control info J 610 may include a fourth set of bits (e.g., $S_J$ bits 626). A control information priority sorting and grouping component 612 may sort the control information 1, 2, . . . , J from a high priority to a low priority. The priority may be pre-determined according to one or more preset rules. The priority may be configured by the eNB (or gNB) or network, e.g., via higher layer signaling such as RRC signaling or system information. At 612, control information may be sorted (e.g., based on control information type) based on one or more preset priorities and/or configured priorities. At 612, the sorted control information may be grouped into Q groups. For example, the sorted control information may be sorted into a first group (e.g., such as Group 1 630), a second group (e.g., such as Group 2 632), and/or a third group (e.g., such as Group Q 634). Each of the Q groups may include one or more instances of control information based on the priorities. The control information may be grouped such that the same control information type that has multiple copies with the same or similar priority are in one group. For example, multiple CQIs, e.g., wideband CQI and/or multiple subband CQIs, may be grouped into the same control information group.

The control information may be grouped such that different control information types that have the same or similar priority are grouped into one control information group. For example, different control information types such as PMI(s) and/or CQI(s) may be grouped into the same control information group.

The control information may be grouped such that control information bits that have the same or similar priority are grouped into the same control information group. For example, MSBs associated with a control information type may be grouped into a first group. LSBs associated with a control information type may be grouped into a second group.

Bit channel grouping and priority mapping 640 may be used to partition bit channels into bit channel groups and may map the groups of control information into bit channel groups. Bit channels of Polar code may be partitioned into Q groups, for example, based on a required number of groups and/or size of the group(s). Bit channels may be partitioned and may be grouped into multiple groups based on the bit channel capacities, qualities, reliabilities, priorities, and/or the like. For example, bit channels that have the same or similar bit channel capacities and/or priorities may be partitioned and/or grouped into the same bit channel group. A bit channel group priority mapping may include mapping the control information groups to the bit channel groups (e.g., one by one) with corresponding priorities. Bit channel groups may be ranked from high to low based on their priorities and may include a one-to-one mapping of control information group to bit channel group. A control information group with a highest priority (e.g., control information group 1 630) may be mapped to a first bit channel group (e.g., bit channel group 1 642) that has the highest bit channel capacity. A control information group with a second highest priority (e.g., control info group 2 632) may be mapped to a second bit channel group (e.g., bit channel group 2 644) which has the second highest bit channel capacity, etc. A last control information group (e.g., control info group Q 634) may be mapped to a last bit channel group (e.g., bit channel group Q 646).

Bit channel grouping may rearrange the bit channels in groups based one or more of bit channel capacities, qualities, reliabilities, priorities, and/or the like. Bit channel grouping may form Q groups that correspond to Q groups of control information. Priority mapping may map control information groups to bit channel groups. Bit channel groups may include different bit channels (e.g., either in a localized or distributed fashion for bit channels). Grouping of the bit channels may be determined based on bit channel capacities, priorities, and/or the like. The bit channels may be grouped based on a required number of groups and/or size of the group(s). The grouping of the bit channels may be dynamically determined, for example, depending on the number of groups of control information, the number of bits of each group of control information, etc. The polar encoder 650 may generate coded control information bits 652 based on the first, second, and/or third set of bits. The polar encoder 650 may generate the coded control information bits 652 based on the first, second, and/or third bit channel groups. For example, the first, second, third, and/or fourth control information may be polar encoded using a code construction 660.

Figure 7:
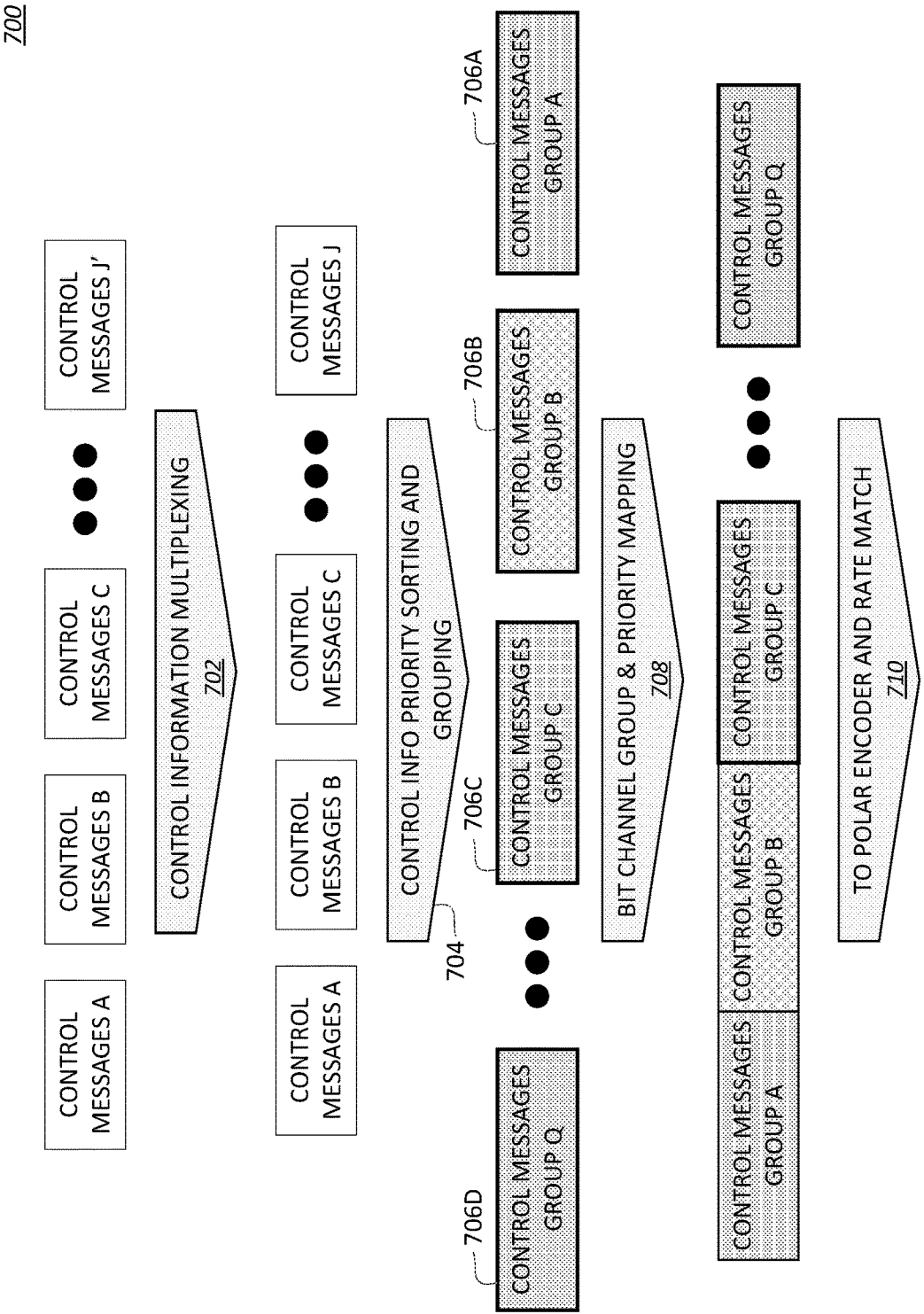
FIG. 7 depicts an example prioritized control information channel coding using polar coding.

FIG. 7 depicts an example prioritization 700 of control information for channel coding using Polar code. The control information may include a plurality of control messages (e.g., control messages A, B, C, J'). At 702, control messages may be multiplexed (e.g., prior to prioritization). There may be Q control messages. Control information multiplexing may include multiplexing the control messages. The multiplexing may multiplex and/or select the control messages to be included in the joint coding. After multiplexing, one or more control messages may appear at the output of the control information multiplexing. For example, as shown in FIG. 7, messages A, B, . . . , J may be multiplexed and may appear at the output of the control information multiplexing. At 704, the control messages may be sorted and/or grouped based on priority. For example, control information priority sorting and grouping may include sorting control messages based on their priorities and the sorted control messages may be grouped into proper groups. The control messages may be grouped into multiple control message groups 706A, 706B, 706C, 706D. The multiple control message groups may include a first control message group 706A (e.g., Control Messages Group A), a second control message group 706B (e.g., Control Messages Group B), a third control message group 706C (e.g., Control Messages Group C), and/or a fourth control message group 706D (e.g., Control Messages Group Q). As shown in FIG. 7, control messages A, B, . . . , J may be sorted from high to low based on the priorities. The first control message group 706A may be associated with the highest priority and the fourth control message group 706D may be associated with the lowest priority.

At 708, bit channel grouping and priority mapping may be performed on the control message groups. Bit channel grouping and priority mapping may include mapping the control message groups 706A, 706B, 706C, 706D to the proper bit channel groups according to the ranked priorities. At 710, the mapped control messages to bit channel groups may be sent to the input of a Polar encoder for joint coding of control messages.

WTRU feedback may be priority-based. WTRU feedback may include multiple control information, messages, and/or fields which may include but is not limited to: synchronization signal (SS) block index (SSBI), rank indicator (RI), precoding matrix indicator (PMI), channel quality indicator (CQI), CSI-RS resource indicator (CRI), precoder type indicator (PTI), HARQ ACK/NACK, Beam ID, scheduling request (SR), other WTRU feedback information, and/or the like. Different WTRU feedback types may have different priorities. For example, RI may be more important than PMI and/or CQI (e.g., since PMI and CQI are measured and computed based on RI). ACK/NACK may be more important than RI, PMI, and/or CQI, e.g., since ACK/NACK may require lower bit errors than other control information. Control messages may be multiplexed, prioritized, mapped, and/or encoded based on respective pre-determined priorities associated with the WTRU feedback. For example, control messages may be sorted based on respective priorities associated with the control information type. One or more of the control messages may be grouped, for example, based on the respective priorities. Control messages associated with control information types of the same or similar priority may be grouped into a control information group. The bits of the control information group may be grouped into bit level control information groups. The control information may be mapped to one or more bit channels of a polar encoder, for example, based on the sorting and/or the grouping. The control messages, control information groups, and/or bit level control information groups may be mapped according to their priority.

WTRU feedback priority may be dependent on the network and/or configuration. For example, in LTE and LTE-A, RI and PMI may play a larger or more important role than CQI in optimizing the spatial multiplexing configuration for maximum rate transmissions. More reliable transmission of RI and PMI may result in nearer-to-optimal signal configuration. HARQ ACK/NACK may have a higher priority than CQI (e.g., due to the fact that HARQ ACK/NACK may affect HARQ retransmission, latency, and throughput while CQI may only affect the scheduling and/or some degradation of CQI may only result in limited degradation of link adaptation).

Figure 8:
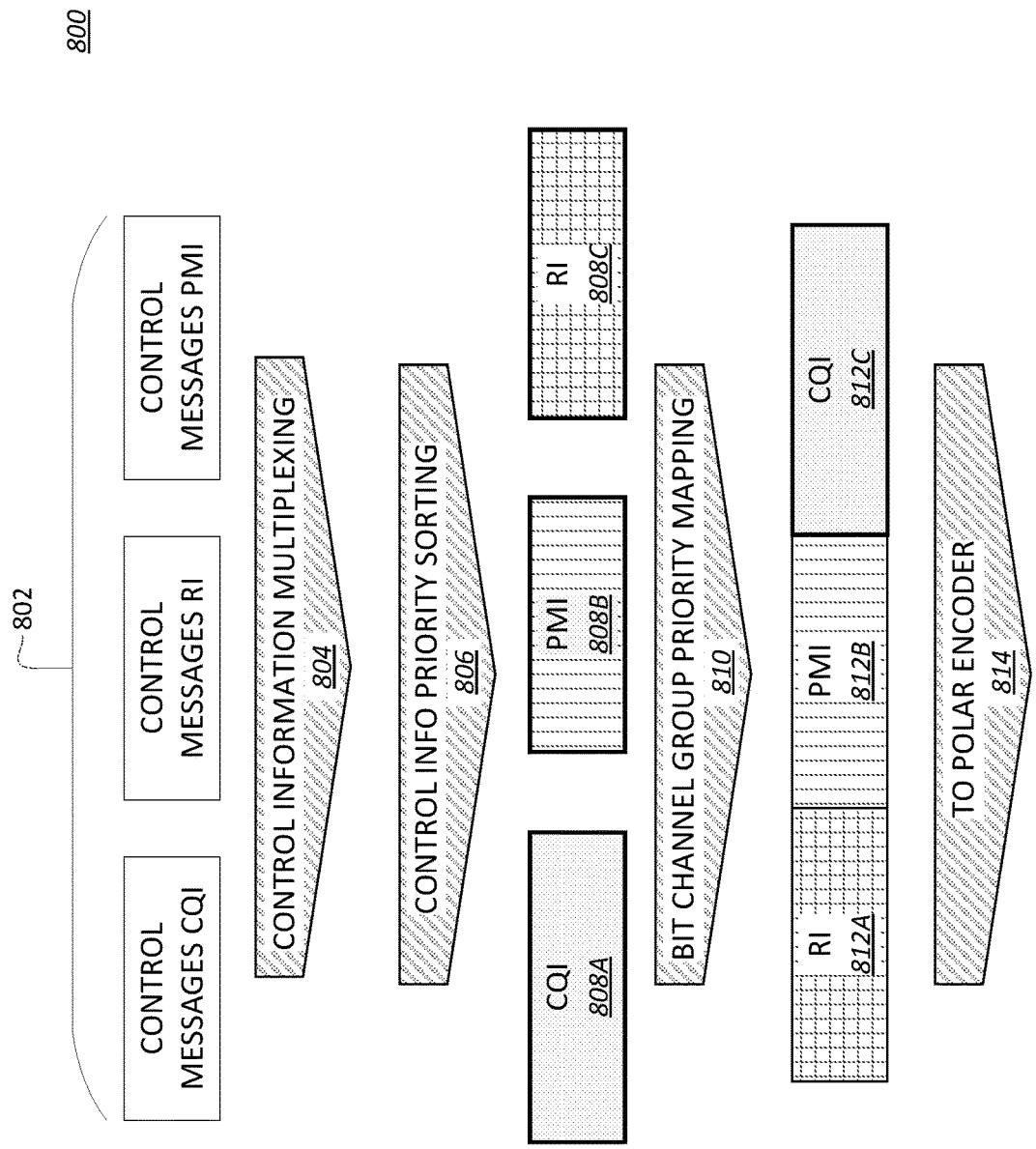
FIG. 8 depicts an example prioritization of control information using polar coding.

FIG. 8 depicts an example prioritization 800 of control information using polar codes. For example, the control information may include CQI, RI, and/or PMI control messages. The CQI, RI, and/or PMI control messages may be priority-based joint coded using polar codes. WTRU feedback, e.g., such as CQI, RI and PMI may arrive in the same slot, subframe, TTI, short TTI, self-contained TTI, self-contained slot, mini-slot, and/or the like at the random order to be transmitted. For example, control messages 802 associated with CQI, RI, and/or PMI may be determined. At 804, the control messages 802 may be multiplexed. At 806, the control messages 802 may be sorted based on priority. After multiplexing, different control messages such as RI, RI/PMI, or RI/PMI/CQI may be an output of multiplexing. For example, the control messages 802 may be grouped into a CQI group 808A, a PMI group 808B, and an RI group 808C. After sorting, ranking of control messages from high to low based on priorities may be (RI), (PMI) and (CQI) in this order, or (RI), (PMI, CQI) in this group order if PMI and CQI are grouped into a single group. At 810, the CQI group 808A, the PMI group 808B, and the RI group 808C may be mapped to one or more bit channel groups 812A, 812B, 812C. For example, the bits of the RI group 808C may be mapped to an RI bit channel group 812A. The RI bit channel group 812 may be the highest priority bit channel group. The bits of the PMI group 808B may be mapped to the PMI bit channel group 812B. The PMI bit channel group 812B may be the second highest priority bit channel group. The bits of the CQI group 808A may be mapped to a CQI bit channel group 812C. The CQI bit channel group 812C may be the third highest priority bit channel group. For example, (RI) may be mapped to the higher bit channel group, and (PMI, CQI) may be mapped to a lower bit channel group. Using polar coding priority tiers may result in increased reliability. At 814, the bit channel groups 812A, 812B, 812C may be polar encoded.

Figure 9:
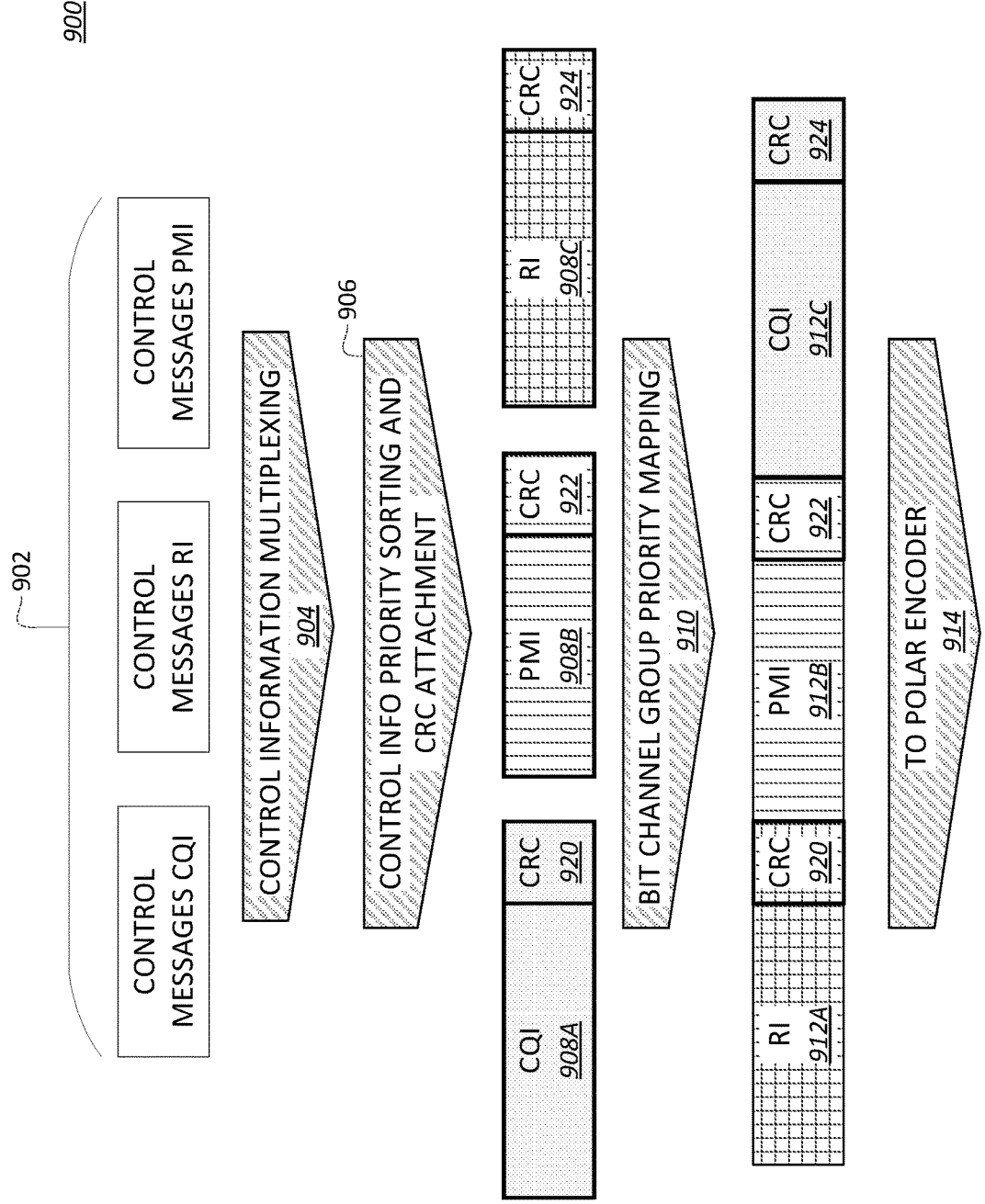
FIG. 9 depicts an example prioritization of control information using polar coding.

FIG. 9 depicts an example prioritization 900 of control information using polar coding. A control message may be an instance of control information, a control field, a bit field, and/or the like. One or more error check bits may be added to the control information (e.g., such as WTRU feedback), for example, as shown in FIG. 9. Error check bits may include a CRC, a short CRC with X bits such as 4-bit CRC, 8-bit CRC for X=4 and 8 respectively, and/or the like. X=0 may indicate that CRC is not attached. CRC may be added to all control messages separately, jointly, or a combination of both. For example, CRC may be added to each control information group, as shown in FIG. 9. A control information group may be a collection and/or a group of instances of control information, control messages, control fields, bit fields, and/or the like of the same or different control information type.

Control messages 902 associated with CQI, RI, and/or PMI may be determined. At 904, the control messages 902 may be multiplexed. Different control messages such as RI, RI/PMI, or RI/PMI/CQI may be an output of multiplexing. At 906, the control messages 902 may be sorted based on priority. For example, the control messages 902 may be grouped into a CQI group 908A, a PMI group 908B, and an RI group 908C. After sorting, ranking of control messages from high to low based on priorities may be (RI), (PMI) and (CQI) in this order, or (RI), (PMI, CQI) in this group order if PMI and CQI are grouped into a single group. At 910, the CQI group 908A, the PMI group 908B, and the RI group 908C may be mapped to one or more bit channel groups 912A, 912B, 912C. For example, the bits of the RI group 908C may be mapped to an RI bit channel group 912A. The RI bit channel group 912A may be the highest priority bit channel group. The bits of the PMI group 908B may be mapped to the PMI bit channel group 912B. The PMI bit channel group 912B may be the second highest priority bit channel group. The bits of the CQI group 908A may be mapped to a CQI bit channel group 912C. The CQI bit channel group 912C may be the third highest priority bit channel group. For example, (RI) may be mapped to the higher bit channel group, and (PMI, CQI) may be mapped to a lower bit channel group. Using polar coding priority may result in increased reliability. CRC 920, 922, 924 may be added (e.g., selectively applied and/or attached) to one or more channel groups 908A, 908B, 908C and/or one or more bit channel groups 912A, 912B, 912C. CRC 920 may be added to the CQI group 908A, CRC 922 may be added to the PMI group 908B, and/or CRC 924 may be added to the RI group 908C. For example, CRC 922 may be added to the PMI group 908B and/or CRC 920 CQI group 908A while CRC may not be added to the RI group 908C. CRC 920, 922, 924 may be added to the RI group 908C and the PMI group 908B jointly and CRC may not be added to the CQI group 908A. A single CRC may be added to RI, PMI, and CQI jointly. At 914, the bit channel groups 912A, 912B, 912C with CRC may be polar encoded.

Figure 10:
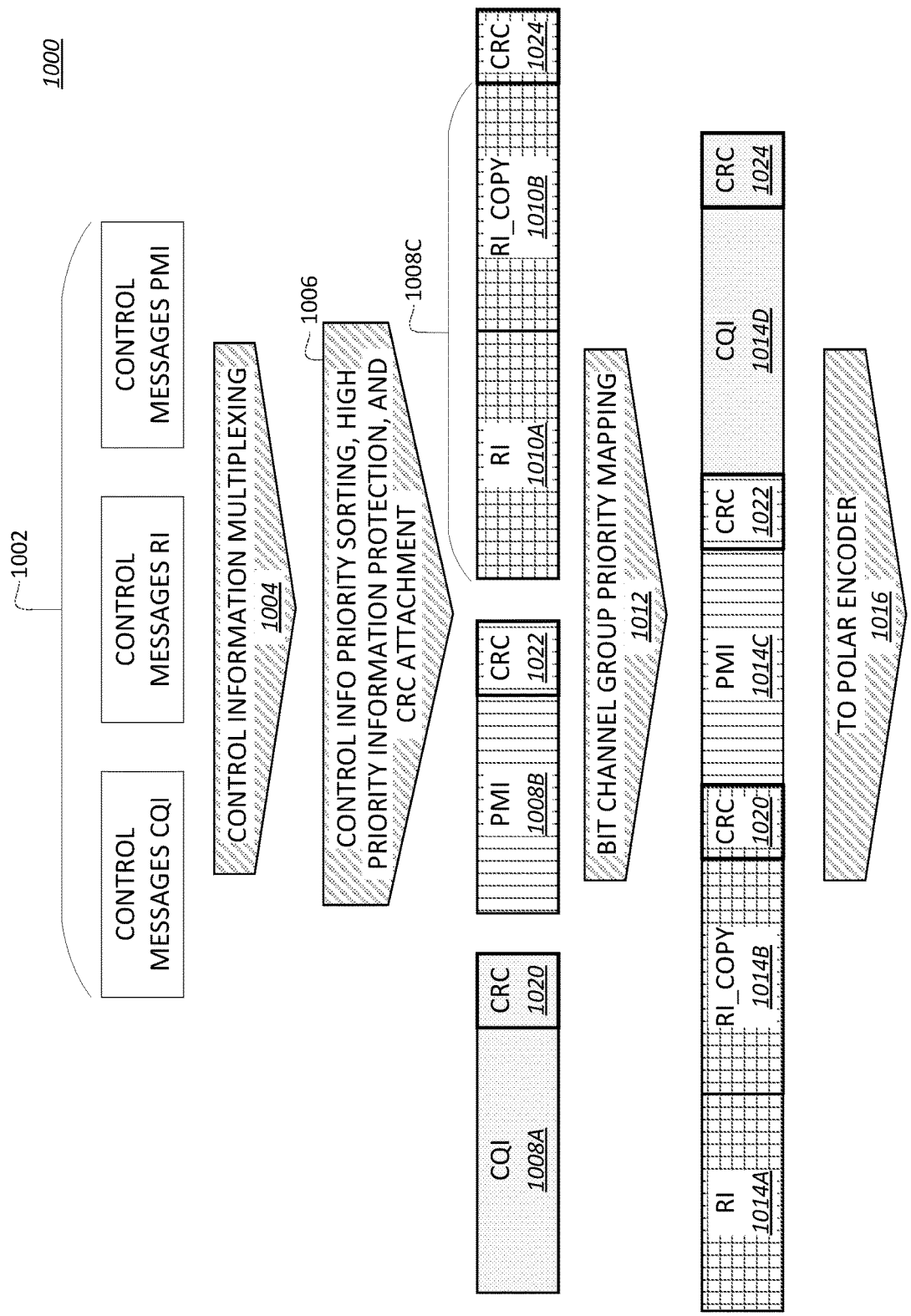
FIG. 10 depicts an example polar coding prioritization of control information with repetition protection on high priority information.

FIG. 10 depicts an example prioritization 1000 of control information with repetition protection on high priority information using polar coding. Some variable rates encoding of high priority control information may be applied, e.g., in addition to error check bits added to WTRU feedback. For example, some repetition coding on a high priority control message, e.g., RI information may be applied. Repetition coding on the high priority RI information may reduce the effective coding rate of the RI information. For example, before the CRC protection of the control information, the high priority information (e.g., RI information) may be repeated. As shown in FIG. 10, control messages 1002 may be multiplexed, at 1004. At 1006, the control messages 1002 may be sorted and/or grouped based on priority. For example, the control messages may be grouped into a first group 1008A (e.g., a CQI group), a second group 1008B (e.g., a PMI group), and a third group 1008C (e.g., an RI group). The third group 1008C may include an RI group 1010A and an RI copy group 1010B. The RI copy group 1010B may be a repeat of the RI group 1010A.

At 1012, the bits of the first group 1008A, the second group 1008B, and the third group 1008C may be mapped to one or more bit channel groups, for example, based on priority. For example, the bits of the first group 1008A may be mapped to a CQI bit channel group 1014D. The bits of second group 1008B may be mapped to a PMI bit channel group 1014C. The bits of the third group 1008C may be mapped to an RI bit channel group 1014A and/or an RI Copy bit channel group 1014B. CRC 1020, 1022, 1024 may be added (e.g., selectively applied) to one or more channel groups 1008A, 1008B, 1008C and/or one or more bit channel groups 1014A, 1014B, 1014C, 1014D. CRC 1020 may be added to the first group 1008A, CRC 1022 may be added to the second group 1008B, and/or CRC 1024 may be added to the third group 1008C. A single CRC may be added to the RI group, the RI copy group, the PMI group, and the CQI group jointly. At 1016, the bit channel groups 1014A, 1014B, 1014C, 1014D with CRC may be polar encoded.

The variable rates encoding and/or CRC protection of the control information may be jointly designed with prioritization. For example, the repetition of the high priority information may include additional protection of the control message, and the priority of the resulting control message may be reduced when mapping to the bit channels due to the additional protection.

The priority-based WTRU feedback described herein may be applied to Wideband feedbacks, e.g., wideband PMI, wideband CQI, etc.

The priority-based WTRU feedback described herein may be applied to Subband feedbacks (e.g., feedback per subband), e.g., multiple subband PMIs, multiple subband CQIs. For example, CQI1, CQI2, . . . CQI_K for subbands 1, 2, . . . , K respectively, PMI1, PMI2, . . . PMI_K for subbands 1, 2, . . . , K correspondingly, etc.

The priority-based WTRU feedback described herein may be applied to feedback per codeword (CW), e.g., CQI1 for CW1, CQI2 for CW2, . . . , CQI2 for CW_K. Or ACK/NACK1 for CW1, ACK/NACK2 for CW2, . . . , ACK/NACK K for CW_K, etc.

The priority-based WTRU feedback described herein may be applied to WTRU feedbacks for carrier aggregation (e.g., primary component carrier (CC), secondary CCs) or for different frequencies, spectrum, or bands, e.g., RI1, PMI1, CQI1 for CC1, RI2, PMI2, CQI2 for CC2, . . . , RI_K, PMI_K, CQI_K for CC_K, etc. For example, a higher priority may be assigned to a primary CC and/or a lower priority may be assigned to a secondary CC. A higher priority may be assigned to a serving cell and/or a lower priority may be assigned to a non-serving cell. The control information (e.g., DL/UL control information, WTRU feedback, and/or the like) associated with a primary CC, a secondary CC, a serving cell, and/or a non-serving cell may be assigned different priorities and may be encoded based on the different priorities using Polar codes as described herein. Control information for different frequencies, bands, subbands, etc. may be assigned different priorities and may be encoded based on the different priorities using Polar codes as described herein.

The priority-based WTRU feedback described herein may be applied to feedback for azimuth angle of arrival (AoA), azimuth angle of departure (AoD), zenith angle of arrival (ZoA), zenith angle of departure (ZoD), beam directions, etc.

The priority-based WTRU feedback described herein may be applied to WTRU feedbacks for massive MIMO. Additional WTRU feedback may be needed for a large scale antenna system.

The priority-based WTRU feedback described herein may be applied to WTRU feedbacks for coordinated multiple point (CoMP) transmission and/or network MIMO. Additional WTRU feedback may be needed for multiple gNBs and/or eNBs in CoMP and/or network MIMO.

The priority-based WTRU feedback described herein may be applied to WTRU feedback for different spectrums. Additional WTRU feedback may be required for cmW and/or mmW at higher frequencies bands and/or spectrums.

Priority based mapping, as described herein, may be combined with RE mapping and/or OFDM symbol mapping such that ACK/NACK and/or RI may be mapped to REs or OFDM symbols which are near or adjacent to reference signal (RS) locations for better channel estimation.

Control information may be prioritized at bit level for joint coding of control channel may be performed.

A single control information bit level may be prioritized. In addition to control information or field priority at control field level across multiple control fields, control bits may have different priorities within the same control message and/or field. Some control bits may have a higher priority than the other control bits. A control message may be prioritized at the bit level (e.g., for the purposes of ensuring a minimal level of communications optimality). For example, a 4 bit channel quality indicator (CQI) measurement may prioritize the two most significant bits, by mapping the two most significant bits (MSBs) to a higher quality bit channel while the two least significant bits (LSBs) may be mapped to a lower quality bit channel. In the event of a bit error on one or more lower priority bit channels, the CQI may provide a coarse measurement of channel quality.

Figure 11:
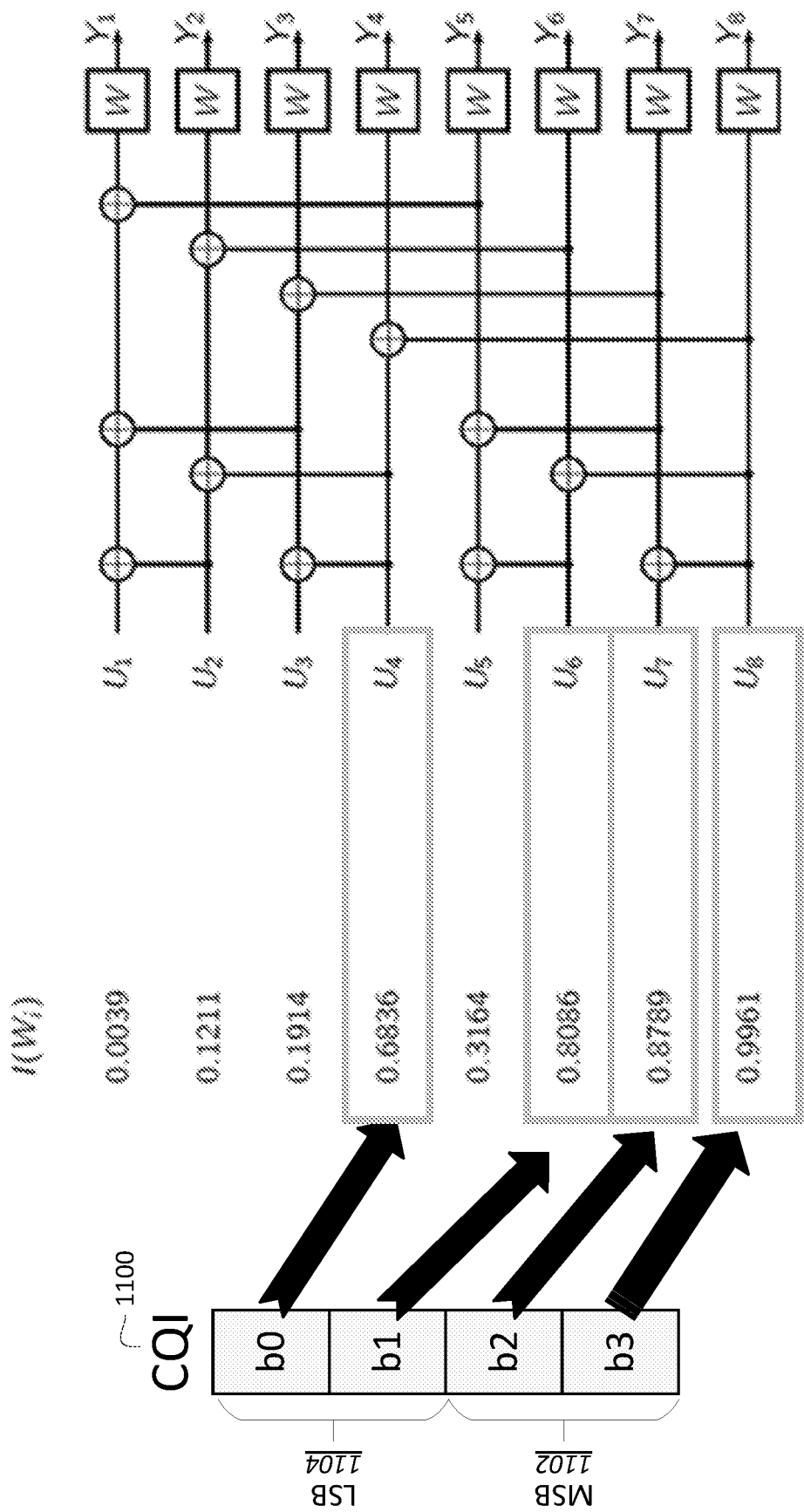
FIG. 11 depicts an example priority-based channel quality indicator (CQI) precision.

FIG. 11 depicts an example priority-based control message bit level precision. Bit channel mapping may be performed for a single individual CQI 1100 using bit channel priority mapping. Priority mapping may prioritize a bit-level control message precision for the CQI 1100 suitable for polar coding. The CQI 1100 may be a 4-bit CQI, for example. The CQI 1100 may have bits b0, b1, b2, and b3. The most significant bits (MSB) 1102 of a 4-bit CQI may be assumed to be b3 and b2. The least significant bits (LSB) 1104 of a 4-bit CQI may be assumed to be b1 and b0. A priority mapping function may map MSB 1102 b3 and b2 to a highest and a second highest channel capacity bit channels for U8 and U7. LSB 1104 b1 and b0 may be mapped to the next highest and second highest channel capacity bit channels for U6 and U4. Since U4 may have a higher bit channel capacity (e.g., 0.6836) than the bit channel capacity (e.g., 0.3164) of U5, LSB 1104 b0 may be mapped to U4 (e.g., instead of U5 for optimum performance).

Figure 12:
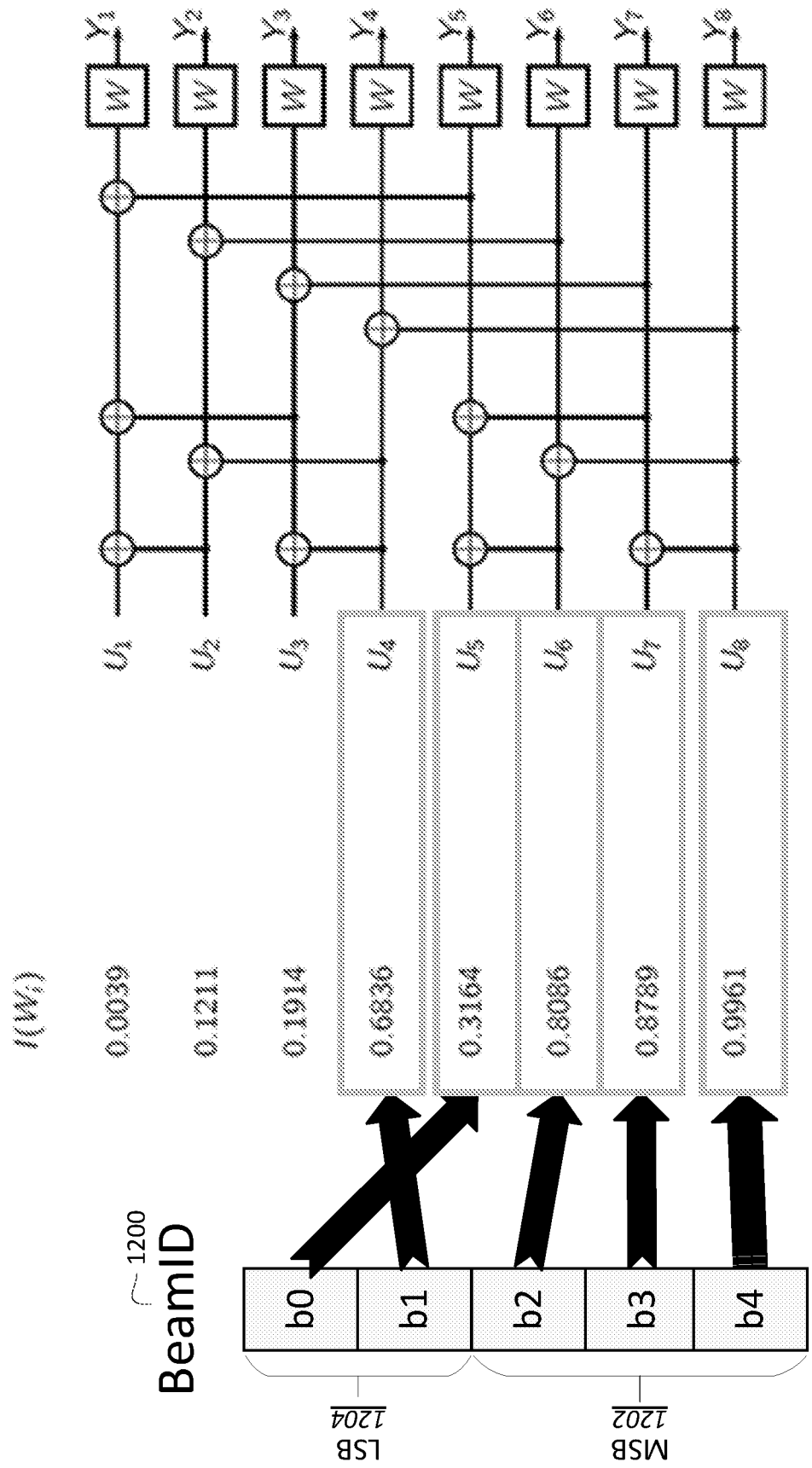
FIG. 12 depicts an example priority-based beam identification (BeamID) precision.

FIG. 12 depicts an example priority-based beam identification (BeamID) precision. Bit channel mappings may be performed for an individual Beam ID 1200 using priority mapping. Priority mapping may prioritize bit-level control message precision for the Beam ID 1200 suitable for polar coding. The Beam ID 1200 may be a 5-bit Beam ID. The MSBs 1202 may be assumed to be b4 and b3 (e.g., in that order). The LSBs may be assumed to be b2, b1, and b0. A priority mapping function may map MSB 1202 b4 and b3 to a highest and a second highest channel capacity bit channels, e.g., U8 and U7, while LSB 1204 b2, b1, and b0 may be mapped to the next three highest channel capacity bit channels, e.g., U6, U4, and U5 as shown in FIG. 12.

Beam ID may prioritize the most significant bits, for example, using bit channel mapping with polar code. For example, the most significant bits may be mapped to a higher quality bit channel while less significant bits may be mapped to lower quality bit channels. In the event of bit error on one or more lower priority bit channels, the Beam ID may provide a coarse measurement of beam selection, direction, and/or identification.

CRC may be attached (e.g., selectively applied) to one or more control messages. Selectively applying a CRC may include determining to attach the CRC to one or more bit level control information groups (e.g., not all bit level control information groups). Selectively applying a CRC may include determining to jointly attach the CRC to at least two bit-level control information groups. Selectively applying a CRC may include determining to attach the CRC to each MSB control information group. Selectively applying a CRC may include determining to attach a first CRC to each MSB control information group and a second CRC to each LSB control information group. The precision of the CQI may be verified using priority tier CRC values that are computed for messages being transmitted across bit channels. The format of the control messages may be determined for proper recovery of control information.

A priority-based CQI precision may be used when combining multiple small sized polar codes, as described herein. Each small size component polar code may have its own bit channel capacity, quality, and/or reliability ranking. A WTRU, a relay, and/or a base station may perform a joint ranking of bit channel capacity, quality, and/or reliability of the multiple small sized polar codes may be calculated. For example, a WTRU may perform the joint ranking in the uplink and/or in device to device (D2D) communications.

The joint ranking may be performed before the mapping of MSB/LSB of CQI information to the proper bit channels of polar encoder constructed by the multiple small size polar codes. For example, the MSB/LSB of CQI information may be mapped to one or more bit channels of the polar encoder based on the joint ranking.

A WTRU, a relay, and/or a base station may rank (e.g., directly rank) the bit channel capacity, quality, and/or reliability of a Polar encoder constructed by multiple small polar codes. A WTRU may rank the bit channel capacity, quality, and/or reliability in the uplink and/or in D2D communications. For example, the consequential bit channel capacities of a polar code with length 8 may be given by [0.0039 0.1211, 0.1914, 0.6836, 0.3164, 0.8086, 0.8789, 0.9961], while the consequential bit channel capacities of a polar code with length 4 may be given by [0.0625, 0.4375, 0.5625, 0.9375]. A joint (e.g., combined) ranking of the two small polar codes may be represented as $U\_8\^8, U\_4\^4$, $U\_7\^8, U\_6\^8, U\_4\^8, U\_3\^4, U\_2\^4, U\_5\^8, U\_3\^8, U\_4\^8$, $U\_1\^4, U\_1\^8$, where $U\_i\^8$ denotes the i-th bit channel for the length-8 polar code and $U\_i\^4$ denotes the i-th bit channel for the length-4 polar code. A most significant bit of CQI or Beam ID may be placed in $U\_8\^8$, a second most significant bit of CQI or Beam ID may be placed in $U\_4\^4$, and so on. A least significant bit of CQI or Beam ID may be placed in $U\_1\^8$. For other control information and/or WTRU feedback, a most significant bit of control information and/or WTRU feedback may be placed in $U\_8\^8$, a second most significant bit of control information and/or WTRU feedback may be placed in $U\_4\^4$, and so on. A least significant bit of control information and/or WTRU feedback may be placed in $U\_1\^8$.

A WTRU and/or a base station may align Bit channel capacity, quality, and/or reliability among multiple component polar codes that are used to construct a Polar encoder (e.g., to achieve better performance). For example, when a length-8 polar code and a length-4 polar code are combined, the bit channel capacities of the length-4 polar code may be multiplied (e.g., offset) by a factor X, e.g., before the ranking.

A WTRU and/or a base station may apply one or more exclusive Or (XOR) operations on the inputs of component polar codes. When the one or more XOR operations are applied on the inputs of the component polar codes, the resulting code words may have a larger minimum Hamming distance. The rank of the resulting bit channels may change and may be adjusted accordingly.

Multiple smaller sized polar codes may be combined and may be applied to the (e.g., all) priority-based channel coding for control information. Joint ranking of multiple small component polar codes may be used for bit channel grouping and/or priority mapping, as described herein.

Figure 13:
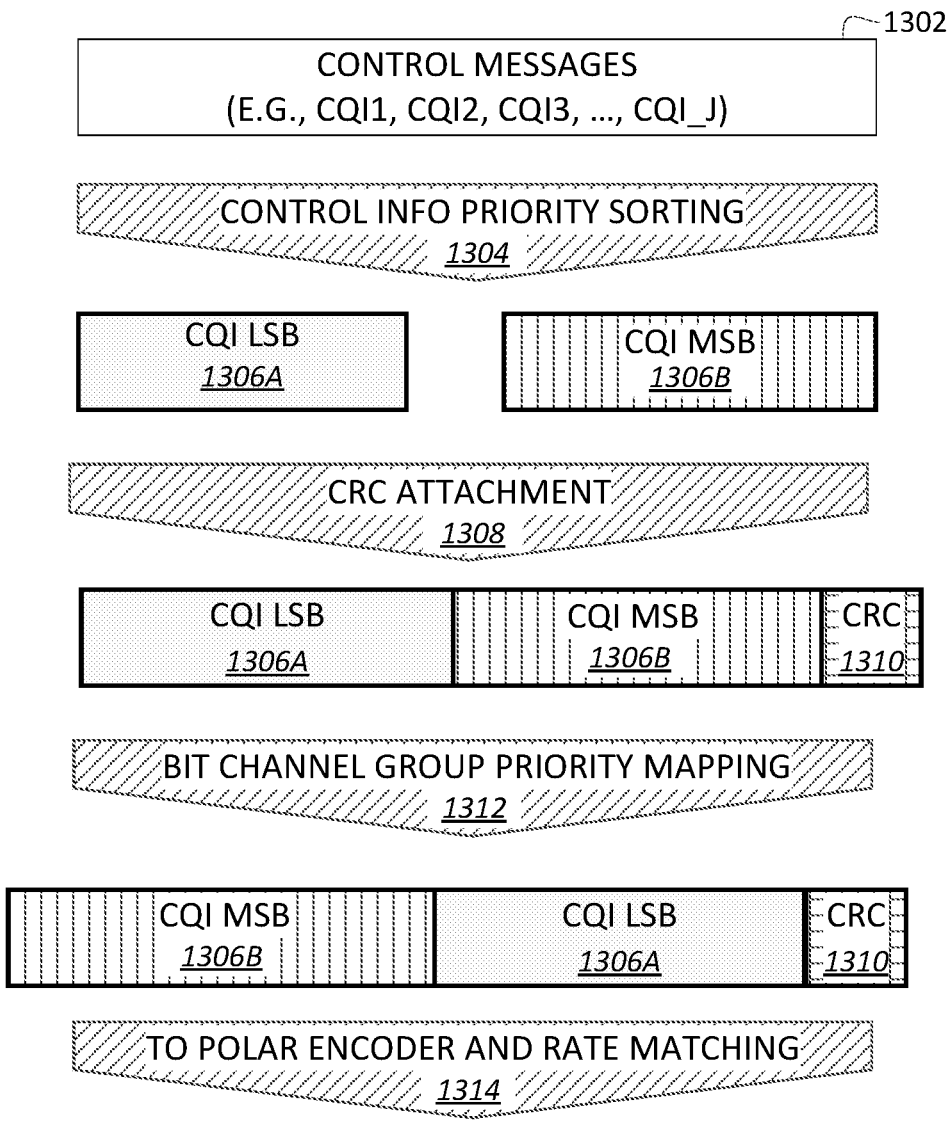
FIG. 13 depicts an example prioritized CQI control message precision using polar coding.

FIG. 13 depicts an example prioritized CQI control message precision using polar coding. For multiple reports for the same control information type, e.g., CQIs, there may be multiple CQI reports corresponding to multiple subband CQIs. CQI bits may be grouped into MSB and LSB groups. For example, multiple CQI control messages 1302 may be sorted, at 1304, based on priority. The CQI control messages 1302 may be sorted into a CQI LSB group 1306A and a CQI MSB group 1306B. Priority sorting may be performed to assign the MSB bit group a higher priority and the LSB bit group a lower priority. After priority sorting, a CRC 1310, a short CRC, and/or the like may be attached (e.g., selectively applied), at 1308, for error checking of CQI bits. For example, the CRC 1310 may be jointly attached to the CQI LSB group 1306A and the CQI MSB group 1306B. CRC may not be attached (e.g., to minimize overhead). Protection on the high priority information, e.g., the repetition of the MSB data, may be applied. Priority mapping may prioritize a LSB bit group and a MSB bit group prepared for a polar encoder. At 1312, priority mapping may map the CQI MSB group 1306B to a higher priority bit channel group of polar encoder and may map the CQI LSB group 1306A to a lower priority bit channel group of polar encoder. When priority mapping is finished, the polar encoder may encode, at 1314, the CQI bits for both MSB and LSB bit groups and the encoded CQI bits for MSB and LSB jointly. The jointly encoded CQI bits for multiple CQIs e.g., $CQI_1$, $CQI_2$, ..., $CQI_J$ may include more protection for a MSB bit group and less protection for a LSB bit group for the same control information type.

Figure 14:
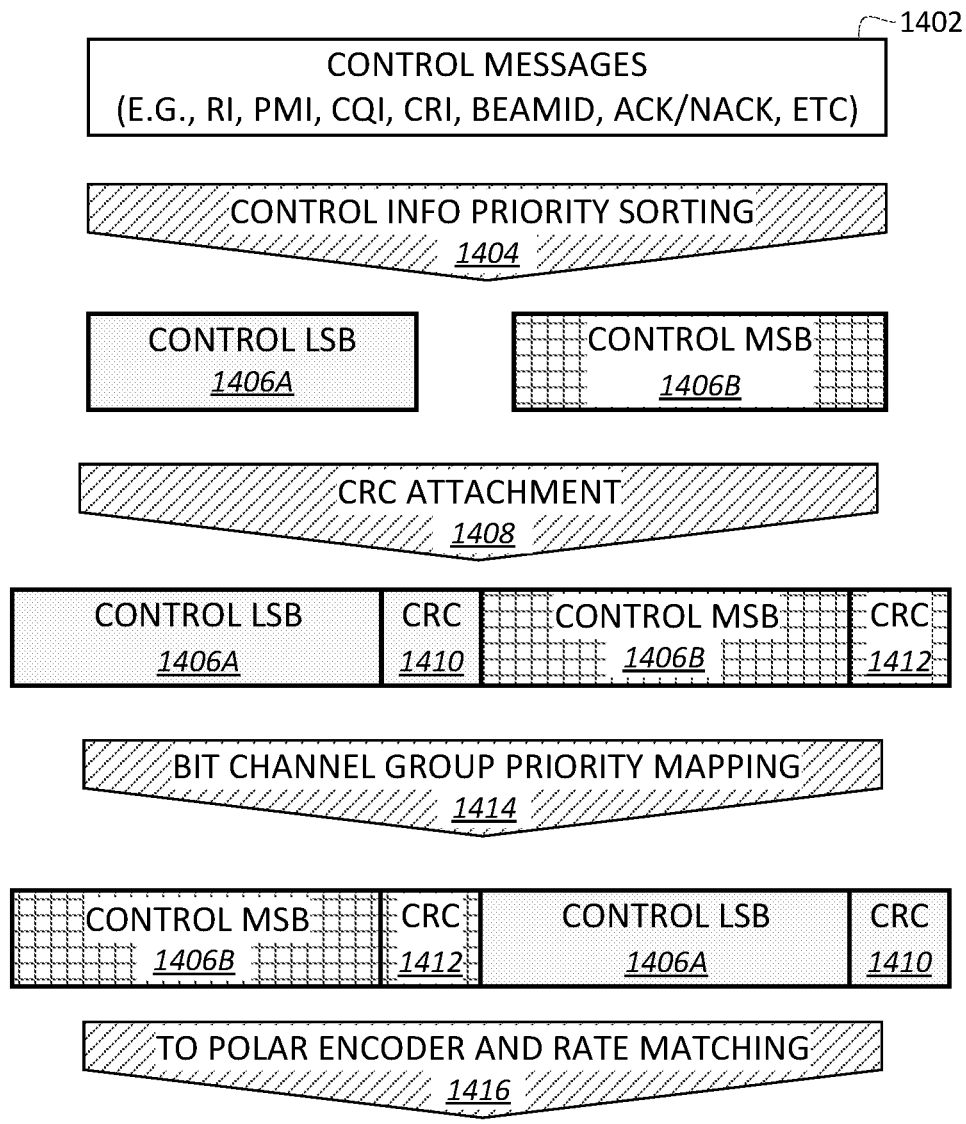
FIG. 14 depicts an example prioritized control message precision using polar coding.

FIG. 14 depicts an example prioritized control message precision using polar coding. Multiple reports of the same control information type may be extended to different control message types such as RI, PMI, PTI, CRI, BeamID, ACK/NACK, etc. Control messages may be partitioned into two bit groups, e.g., LSB and MSB bit groups. For example, control messages 1402 may be sorted, at 1404, into a control LSB group 1406A and a control MSB group 1406B. After priority sorting, a CRC, a short CRC, and/or the like may be attached for error checking of control message bits. For example, at 1408, a first CRC 1410 may be attached to the control LSB group 1406A and a second CRC 1412 may be attached to the control MSB group 1406B. The first CRC 1410 and the second CRC 1412 may be the same CRC. Other protection on the high priority information, e.g., the repetition of the MSB data, may be applied. Priority mapping may prioritize a LSB bit group and a MSB bit group prepared for polar encoder. At 1414, priority mapping may map the control MSB group 1406B to a higher priority bit channel group of a polar encoder and may map the control LSB group to lower priority bit channel group of a polar encoder. When priority mapping is finished, a polar encoder may encode, at 1416, the control message bits jointly for both the control MSB group 1406B and the control LSB group 1406A. The encoded control message bits may include more protection for a MSB bit group and less protection for a LSB bit group for different control information.

One or more error check bits may be attached to control messages. Error check bits may be attached to MSB and LSB bit groups either jointly or separately. Error check bits may be a CRC, a short CRC with X bits such as 4-bit or 8-bit CRC for X=4 or 8, and/or the like. X=0 may indicate that CRC is not attached. FIG. 14 depicts an example prioritized control message precision using polar coding. A CRC or a short CRC (e.g., 4-bit CRC, 8-bit CRC, etc.) may be attached to control MSB and LSB bit groups, e.g., jointly, separately, or a combination of both.

Figure 15:
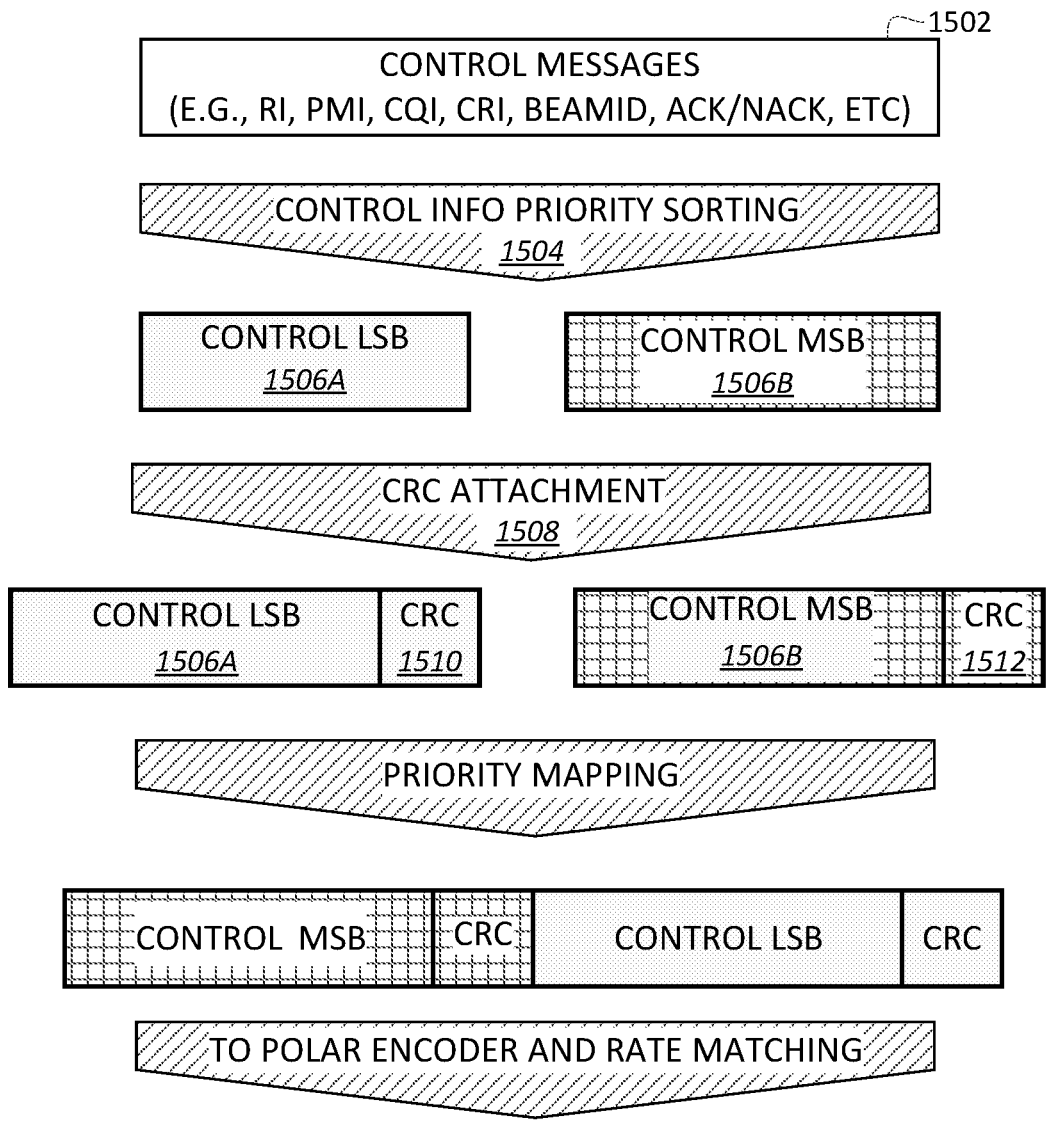
FIG. 15 depicts an example prioritized control message precision with separate CRCs using polar coding.

FIG. 15 depicts an example prioritized control message precision with separate CRCs using polar coding. Control messages 1502 may be sorted, at 1504, into a control LSB group 1506A and a control MSB group 1506B. The control messages 1502 may be sorted based on respective priorities associated with the control information types of the control messages 1502. A CRC or a short CRC may be attached to control MSB and LSB bit groups separately. For example, at 1508, a first CRC 1510 may be attached to a control LSB and a second CRC 1512 may be attached to the control MSB group 1506B. In this case, a gNB or receiver may perform error checking for MSB and LSB separately.

Figure 16:
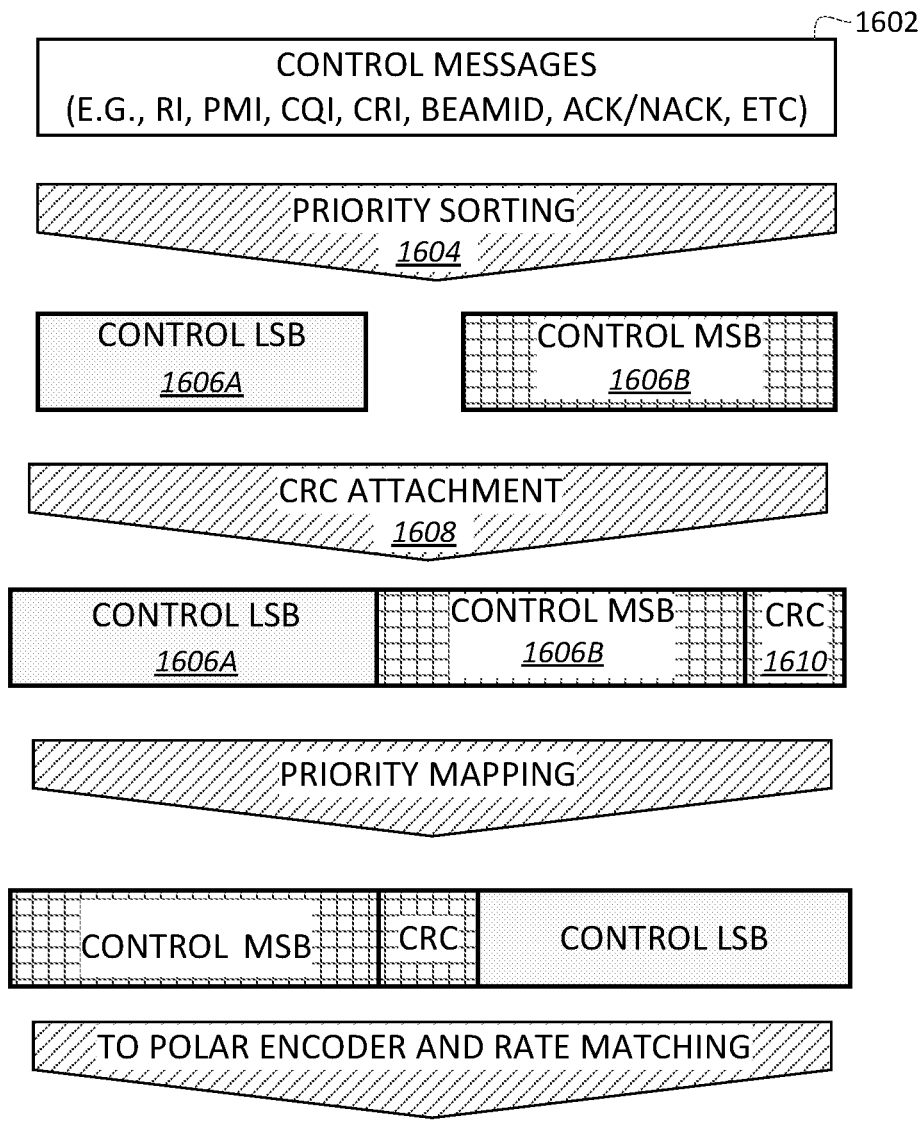
FIG. 16 depicts an example prioritized control message precision with CRC for MSB protection using polar coding.

FIG. 16 depicts an example prioritized control message precision with CRC for MSB protection. Control messages 1602 may be sorted, at 1604, into a control LSB group 1606A and a control MSB group 1606B. The control messages 1602 may be sorted based on respective priorities associated with the control information types of the control messages 1602. A CRC or a short CRC may be attached to the control MSB group 1606B only. For example, a CRC 1610 or a short CRC may attached, at 1608, to the control MSB group 1606A and the CRC 1610 may not be attached to the control LSB group 1606B. A gNB or receiver may perform error check for MSB with minimum CRC overhead.

Control messages, control fields, and/or control bits may be jointly prioritized for joint coding of control information. Multi-stage priority grouping may include one or more of the following.

Control information (e.g., control messages, control fields, control message fields, and/or control bits) may be sorted (e.g., grouped) based on the priorities of the control information, for example at a first level (e.g., at stage 1). For example, the control information may be sorted based on respective priorities associated with the control information types of the control information. Control information and/or messages with the same or similar priority may be grouped into the same group, for example, the control information group.

For each control information group, one or more control bits within a control information group may be grouped into bit level groups based on one or more priorities at bit level, for example at a second level (e.g., at stage 2). For example, control bits of a control information group may be grouped into MSB and LSB bit level control information groups associated with the control information group.

Some control information (e.g., control messages, control fields, control message fields, and/or control bits) may be important, and both MSB and LSB may need more protection. Control information may include CSI-RS resource indicator (CRI), RI, PMI, CQI, BeamID, HARQ ACK/NACK, SS block index, precoder type indicator (PTI), scheduling request (SR) and/or the like.

Figure 17:
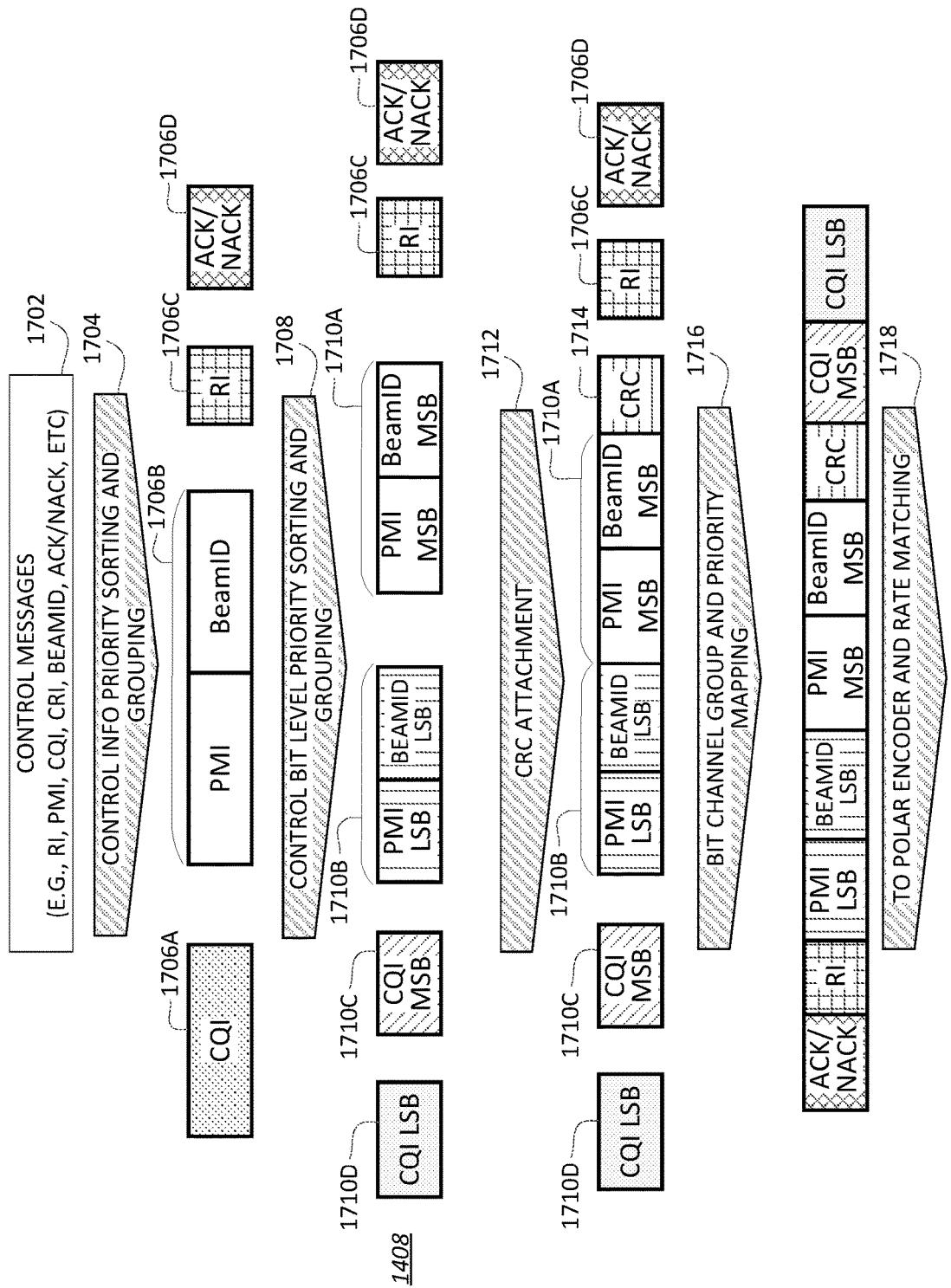
FIG. 17 depicts an example prioritization of control message fields and bit levels using polar coding.

FIG. 17 depicts an example using polar coding to prioritize control message fields and bit level prioritization. Control information (e.g., control messages 1702) may include RI, PMI, CQI, BeamID, HARQ ACK/NACK, and/or the like. Control information priority sorting and grouping may be performed, e.g., at 1704. As shown in FIG. 17, at 1704, control information may be sorted and grouped into groups. For example, the control information may be sorted into a first control information group 1706A, a second control information group 1706B, a third control information group 1706C, and/or a fourth control information group 1706D. The first control information group 1706A may be associated with a first control information type (e.g., CQI). The second control information group 1706B may be associated with a second control information type (e.g., PMI) and a third control information type (e.g., BeamID). The third control information group 1706C may be associated with a fourth control information type (e.g., RI). The fourth control information group 1706D may be associated with a fifth control information type (e.g., HARQ ACK/NACK). The first control information group 1706A may be associated with the lowest priority. The second control information group 1706B may be associated with the second lowest priority. The fourth control information group 1706D may be associated with the highest priority. The third control information group 1706C may be associated with the second highest priority. One or more control information types (e.g., BeamID and PMI) may be assumed to have the same or similar priority and may be grouped together into the same group. HARQ ACK/NACK and RI may be assumed to have a higher priority than BeamID and PMI which in turn may have higher priority than CQI. Grouping may be based on priority, one or more performance requirements, one or more latency requirements, one or more BER requirements, one or more BLER requirements, SNR, and/or the like.

Control bit level priority grouping may be performed at 1708. HARQ ACK/NACK and RI may have a higher priority, and no further grouping may be performed for HARQ ACK/NACK and RI. For example, HARQ ACK/NACK and/or RI may not be broken down into additional fields and/or groups. BeamID and PMI may be grouped together in the same group. Control bits of the first control information group 1706A and/or the second control information group 1706B may be grouped and partitioned into MSB and LSB bit groups. For example, PMI MSB and BeamID MSB may be grouped into a first bit level control information group 1710A and PMI LSB and BeamID LSB may be grouped into a second bit level control information group 1710B, as shown in FIG. 17. CQI bits may be grouped and/or partitioned into MSB and LSB bit groups, for example, a CQI MSB bit level control information group 1710C and a CQI LSB bit level control information group 1710D.

CRC may be attached (e.g., selectively attached) to one or more groups. As shown in FIG. 17, a CRC 1714 may be jointly attached, at 1712, to the first and second bit level control information groups 1710A, 1710B (e.g., selective attachment to the first and second bit level control information groups 1710A, 1710B but not other control information groups). Other protection schemes, e.g., repetition of the high priority information, may be applied to one or more control information groups.

At 1716, the control information may be mapped to the bit channels of the polar encoder based on the respective priorities of control groups and/or the respective priorities of corresponding bit channel groups. The control information may be mapped, at 1716, based on the sorting, the grouping, and/or the selective CRC attachment. At 1718, the control information may be encoded jointly.

Figure 18:
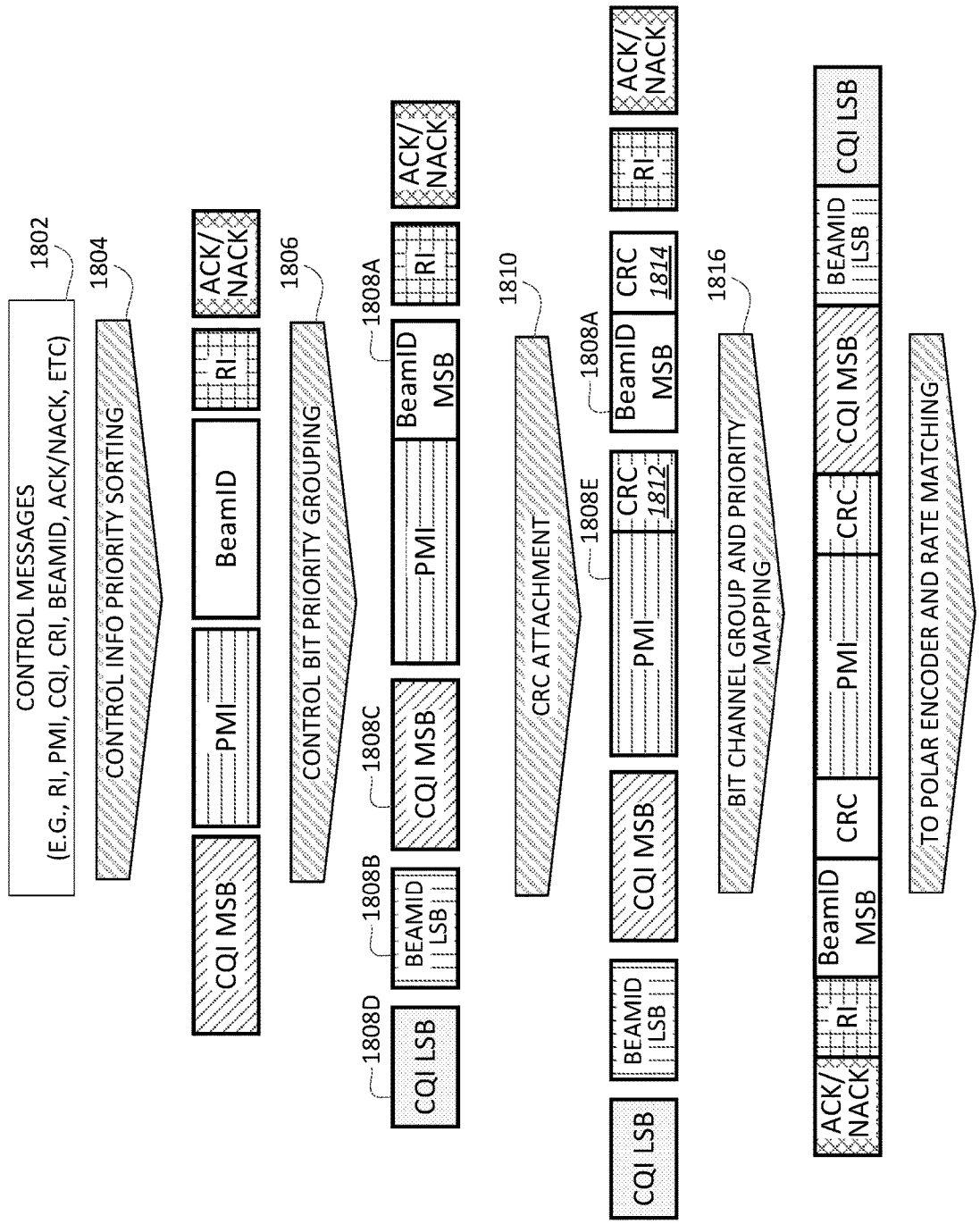
FIG. 18 depicts an example prioritization of control message fields and bit levels using polar coding.

FIG. 18 depicts an example prioritization of control message fields and bit level prioritization using polar coding. At 1804, control information 1802 (e.g., RI, PMI, CQI, BeamID and HARQ ACK/NACK control messages) may be sorted based on priority. The control information 1802 may be assumed to have different priorities that correspond to the control information types. For example, each control information type may have a corresponding control information group. Priority sorting of the control information 1802 may be performed and grouping may be performed at 1804. For example, the control information 1802 may be sorted based on control information type. Control bit priority grouping may be performed at 1806. BeamID bits may be grouped and partitioned into a BeamID MSB control information group 1808A and a BeamID LSB control information group 1808B. CQI bits may be grouped and partitioned into a CQI MSB control information group 1808C and a CQI LSB control information group 1808D. At 1810, CRC may be selectively attached. For example, a first CRC 1812 may be attached to the BeamID MSB control information group 1808A and a second CRC 1814 may be attached to a PMI control information group 1808E. At 1816, the control information may be mapped to bit channels and may be jointly encoded using polar coding.

Priority-based jointly encoded control information may be multiplexed with un-encoded control information. In LTE systems for the PUCCH formats 2a/2b, the channel quality information (CQI) and the HARQ-ACK information may be jointly transmitted. When a normal cyclic prefix (CP) is used for uplink transmission, the channel quality information may be encoded (e.g., Reed-Muller encoded). The encoded CQI may be multiplexed with the HARQ-ACK information (e.g., raw HARQ-ACK information). Polar encoded multiple control information may be multiplexed.

Figure 19:
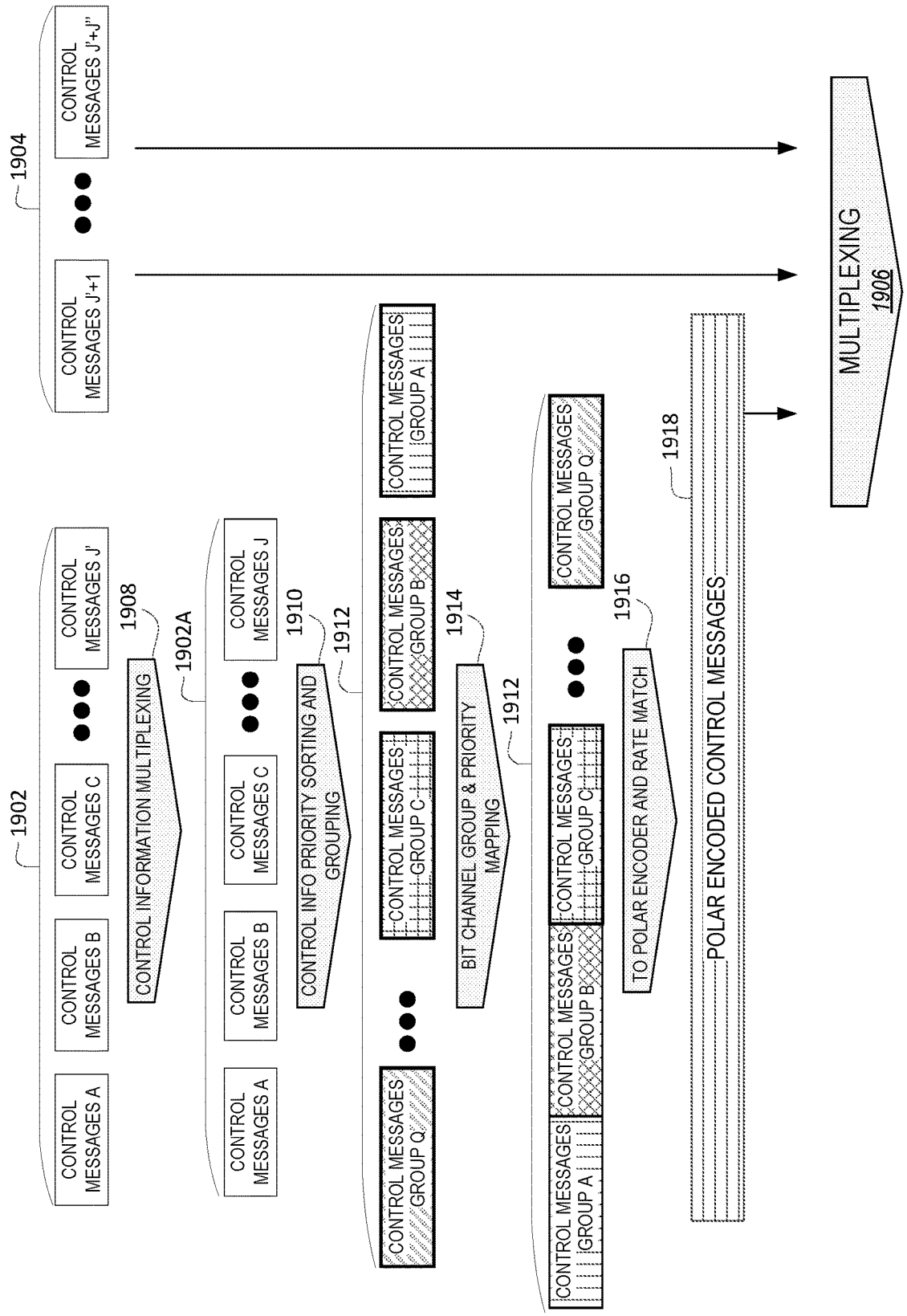
FIG. 19 depicts example prioritized control message fields.

FIG. 19 depicts example prioritized control message fields. For example, as shown in FIG. 7, there may be one or more (e.g., J') first control messages 1902. The first control messages 1902 may be multiplexed, at 1908. The multiplexed control messages 1902A may be sorted and/or grouped, at 1910. The multiplexed control messages 1902A may be sorted into control message groups 1912 (e.g., control messages groups A, B, C, . . . Q). The control messages 1902 may be sorted into the control message groups 1912 based on priority. The control message groups 1912 may be mapped, at 1914, based on priority. The control message groups 1912 may be jointly encoded, at 1916, using a polar code. For example, the control message groups 1912 may be jointly encoded to determine polar encoded control messages 1918. One or more (e.g., J") additional control messages J', . . . +J" (e.g., second control messages 1904) may be multiplexed, at 1906, with the polar encoded control messages 1918 (e.g., the polar jointly encoded J' control messages).

Priority-based jointly encoded WTRU feedback may be transmitted via PUCCH, PUSCH, enhanced PUCCH (e-PUCCH), enhanced PUSCH (e-PUSCH), and/or the like. Control information reports for WTRU feedback such as CSI reports which may include but not limited to RI, PMI, PTI, CQI, AoA, AoD, BeamID, CRI, and/or the like as well as HARQ ACK/NACK, SR may be transmitted either jointly or separately. Different combinations of control information for WTRU feedback may result in different reports, report types, and/or report formats with different priorities and mappings for control messages and bits. Multiple different copies of each control information type may be transmitted due to feedback for both wideband and subband, e.g., wideband PMI, subband PMI, wideband CQI, subband CQI, etc. Multiple different copies of each control information type may be transmitted due to feedback per subband, e.g., multiple subband PMIs, multiple subband CQIs, etc. Multiple different copies of each control information type may be transmitted due to feedback per codeword (CW). Multiple different copies of each control information type may be transmitted due to feedback per CC, frequency and/or band for carrier aggregation or the like. Multiple different copies of each control information type may be transmitted due to feedback per gNB (or eNB) or per site e.g., for coordinated multiple point (CoMP) transmission and network MIMO.

Priority-based jointly encoded control information for WTRU feedback may be transmitted using periodic or aperiodic PUCCH and/or aperiodic or periodic PUSCH. For example, for small payload control information, PUCCH, enhanced PUCCH (e-PUCCH) may be used while for large payload control information, PUSCH or e-PUSCH or the like may be used. For large payload control information, an extended PUCCH, large size PUCCH, and/or e-PUCCH or the like may be used. Multiplexing of control message and WTRU feedback with UL-SCH on PUSCH or the like may also be used. New or modified PUSCH or new PUCCH formats, reports or report types may be required to transmit different combinations of control information with different priorities and/or payload sizes (e.g., to accommodate different joint coding of control information for WTRU feedback).

Polar coding may be performed on control information. Polar coding may include deciding between Concatenated PC Polar Code and Non-concatenated PC Polar Code.

As described herein, the "To polar encoder" block may be used to encode multiple control messages, for example, based on their priorities. The polar code may include concatenated PC polar code and/or non-concatenated PC polar code. The non-concatenated PC polar code may result in desirable BLER performance, for example, if there is no deep puncturing. If a non-concatenated PC polar code must puncture a large number of bits, the BLER performance of the non-concatenated PC polar code may degrade. In this case, a concatenated PC polar code may achieve better BLER performance, which may avoid the deep puncturing. The concatenated PC polar code may result in reduced decoding latency when compared to the non-concatenated PC polar code, for example, since each segment may be decoded in parallel.

Figure 20:
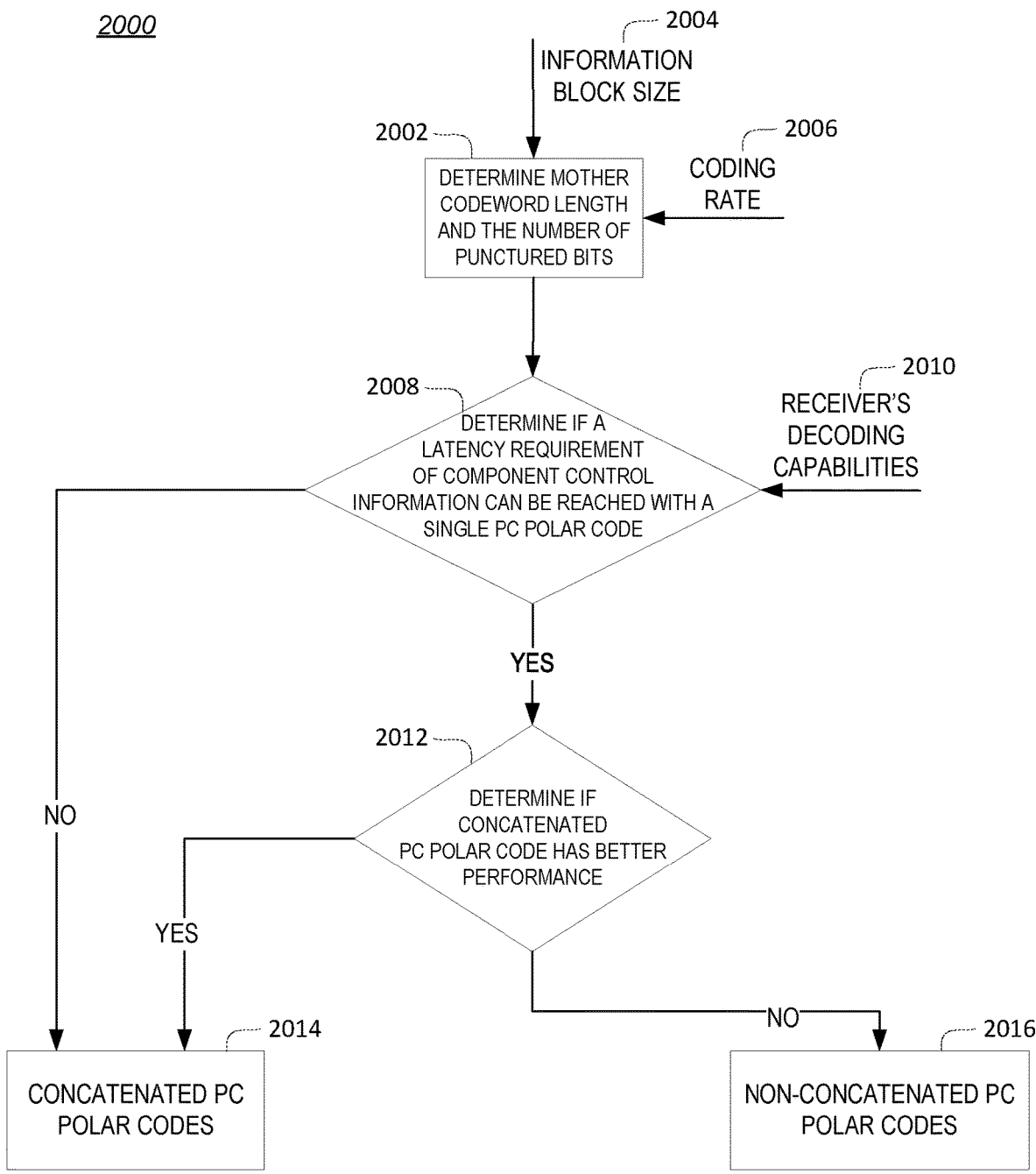
FIG. 20 depicts an example decision making between a concatenated PC polar code and a non-concatenated PC polar code.

FIG. 20 depicts an example decision making 2000 between a concatenated PC polar code and a non-concatenated PC polar code. A total of K information bits (e.g., from one or more control messages) may be encoded. The K information bits may be ordered based on priority. The overall coding rate R may be known. A coded block may be of size $$M = \frac{K}{R}$$

bits. The coded block size may be determined based on an assigned resource element size and/or a modulation order. A mother codeword length may be determined, at 2002, based on an information block size 2004 (e.g., the coded block size) and/or a coding rate 2006 (e.g., the overall coding rate R).

If N is the smallest power of 2, which is larger than $$\frac{K}{R},$$

the mother codeword length may be determined as N, and the number of punctured bits may be $$P = N - \frac{K}{R}.$$

A transmitter (e.g., a transmitting entity) may estimate a decoding latency. The transmitter may be a WTRU, as described herein. At 2008, the transmitter may determine if a latency requirement of the component control information can be reached with a single PC polar code, for example, based on the decoding capability 2010 of the receiver. The transmitter may estimate the decoding latency based on the code rate R, the mother codeword length N, and/or the decoding capabilities of one or more receivers. If the estimated decoding latency is larger than a latency requirement of any of component control information, then the concatenated PC polar code 2014 may be used. The concatenated PC polar code 2014 may be needed to reduce the decoding latency. For example, the transmitter may determine to use the concatenated PC polar code 2014 based on latency requirements associated with the control information. The transmitter may send the control information using the concatenated polar code 2014 or a non-concatenated PC polar code 2016.

At 2012, a transmitter may determine whether to use a concatenated PC polar code 2014 or the non-concatenated PC polar code 2016, for example based on their BLER performance (e.g., if the transmitter has determined that the latency requirement of the component control information can be reached with a single PC polar code). For example, the transmitter may determine which polar code to use based on the BLER performance of concatenated PC polar code 2014 and non-concatenated PC polar code 2016. The transmitter may determine to use the concatenated PC polar code 2014 when the transmitter determines that the concatenated PC polar code 2014 has better performance requirements than the non-concatenated PC polar code 2016.

The BLER performance justification may be based on a number of punctured bits P. For example, if P is greater than a pre-determined threshold, the concatenated PC polar code 2014 may be used. Using the concatenated PC polar code 2014 may avoid deep puncturing. If P is less than or equal to the pre-determined threshold, the non-concatenated PC polar code 2016 may be used.

The BLER performance justification may be based on a ratio of the number of punctured bits P over the mother codeword length N. If the ratio $$\frac{P}{N}$$

is greater than a pre-determined threshold, the concatenated PC polar code may be used. If the ratio $$\frac{P}{N}$$

is less than or equal to a pre-determined threshold, the non-concatenated PC polar code could be used.

The BLER performance justification may be based on a ratio of the number of punctured bits P over the number of information bits K. If the ratio $$\frac{P}{K}$$

is greater than a pre-determined threshold, the concatenated PC polar code may be used. If the ratio $$\frac{P}{K}$$

is less than or equal to the pre-determined threshold, the non-concatenated PC polar code may be used.

The BLER performance justification may be based on any function of (K, N, P).

The transmitter and the receiver may apply the same justification scheme to determine whether concatenated PC polar code or non-concatenated PC polar code is to be used. The transmitter and the receiver may communicate with each other to determine which polar code should be used.

The communication may be based on the following exemplary justification scheme table. For example, the scheme index may be communicated between the transmitter and the receiver.

TABLE 1

Exemplary justification schemes

| Scheme | Parameters | Threshold |
|---|---|---|
| 1 | P | $Y_1$ |
| 2 | P/N | $Y_2$ |
| 3 | P/K | $Y_3$ |
| 4 | f (P, N, K) | $Y_4$ |

Both the transmitter and the receiver may perform the same decision making for concatenated PC polar code or non-concatenated PC polar code, for example, as shown in FIG. 20.

For the concatenated PC polar code, the transmitter may determine a number of parallel segments to be used. The transmitter may send, to a receiver, an indication of the number of parallel segments to be used. The number of parallel segments to be used may be predetermined and may be known to the transmitter and the receiver.

One or more PC Frozen Bits may be allocated for control messages.

For PC polar code (e.g., with or without concatenation), the PC frozen bits may be used to detect one or more errors of certain information bits, for example, based on a copy of the information bits and/or a XOR of the information bits. A transmitter (e.g., an encoder at the transmitter) may insert the PC frozen bits into one or more control messages. A receiver (e.g., a decoder at the receiver) may detect one or more errors using the PC frozen bits. When multiple control messages are to be jointly encoded, the allocation of a PC frozen bit set for each component control message may be determined.

There may be J control messages $S_1, \ldots, S_J$ to be jointly encoded by PC polar code and there may be L PC frozen bits. A total number of information bits from the J control messages may be equal to $K=\Sigma_{i=1}^{J}|S_i|$. PC frozen bits may be allocated for control messages in one or more of the following approaches.

The PC frozen bits may be allocated for control messages equally for each control message. For example, each control message may be allocated $$\frac{L}{J}$$

frozen bits.

The PC frozen bits may be allocated for control messages proportional to each control message length. For example, each control message $S_i$ may be allocated min $$\left\{1, L\frac{S_i}{K}\right\}$$

PC frozen bits.

The PC frozen bits may be allocated for control messages based on the control message priority. If the priorities of the J control messages are $q_1, \ldots, q_J$, where $q_1 \geq q_2 \geq \ldots \geq q_J$, the allocated PC frozen bits for the J control messages may be $L_1 \geq L_2 \geq \ldots \geq L_J$.

The PC frozen bits may be allocated for control messages based on both control message priority and control message length.

Although the features and elements of the present invention are described in the preferred embodiments in particular combinations, each feature or element can be used alone without the other features and elements of the preferred embodiments or in various combinations with or without other features and elements of the present invention.

Although the solutions described herein consider New Radio (NR), 5G or LTE, LTE-A specific protocols, it is understood that the solutions described herein are not restricted to this scenario and are applicable to other wireless systems as well.

Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs). A processor in association with software may be used to implement a radio frequency transceiver for use in a WTRU, WTRU, terminal, base station, RNC, or any host computer.

What is claimed:

1. A method performed by a wireless transmit/receive unit, WTRU, the method comprising:
    generating first control information and second control information, wherein the first control information and the second control information are associated with a plurality of control information types, where each control information type is associated with a respective priority;
    grouping bits from the first control information and the second control information into at least two groups of bits, wherein a first group of bits comprises bits of a first priority from the first and second control information, and a second group of bits comprises bits of a second priority from the first and second control information;
    applying cyclic redundancy check (CRC) bits to one or more of the first group of bits or the second group of bits; and
    transmitting the first group of bits, the second group of bits, and the CRC bits to bit channels of a polar encoder, based on respective priorities of the first and second groups of bits and respective priorities of the bit channels.

2. The method of claim 1, wherein each control information type comprises one or more of a synchronization signal, SS, block index, SSBI, a rank indicator, RI, a precoding matrix indicator, PMI, a channel quality indicator, CQI, a CSI-RS resource indicator, CRI, a precoder type indicator, PTI, a BeamID, an ACK/NACK, or a scheduling request, SR.

3. The method of claim 1, wherein the first group of bits comprises a group of least significant bits, LSBs, from one or more of the first control information or the second control information, and the second group of bits comprises a group of most significant bits, MSBs, from one or more of the first control information or the second control information.

4. A wireless transmit/receive unit, WTRU, comprising a processor configured to:
    generate first control information and second control information, wherein the first control information and the second control information are associated with a plurality of control information types, where each control information type is associated with a respective priority;
    group bits from the first control information and the second control information into at least two groups of bits, wherein a first group of bits comprises bits of a first priority from the first and second control information, and a second group of bits comprises bits of a second priority from the first and second control information;
    apply cyclic redundancy check (CRC) bits to one or more of the first group of bits or the second group of bits; and
    transmit the first group of bits, the second group of bits, and the CRC bits to bit channels of a polar encoder, based on respective priorities of the first and second groups of bits and respective priorities of the bit channels.

5. The WTRU of claim 4, wherein each control information type comprises one or more of a synchronization signal, SS, block index, SSBI, a rank indicator, RI, a precoding matrix indicator, PMI, a channel quality indicator, CQI, a CSI-RS resource indicator, CRI, a precoder type indicator, PTI, a BeamID, an ACK/NACK, or a scheduling request, SR.

6. The WTRU of claim 4, wherein the first group of bits comprises a group of least significant bits, LSBs, from one or more of the first control information or the second control information, and the second group of bits comprises a group of most significant bits, MSBs, from one or more of the first control information or the second control information.

* * * * *